United States Patent [19]

Manabe

[11] Patent Number: 5,754,443
[45] Date of Patent: May 19, 1998

[54] EXPOSURE DATA PROCESSING METHOD AND DEVICE

[75] Inventor: Yasuo Manabe, Kawasaki, Japan

[73] Assignee: Fujitsu Limited, Kanagawa, Japan

[21] Appl. No.: 216,050

[22] Filed: Mar. 22, 1994

[30] Foreign Application Priority Data

May 20, 1993 [JP] Japan ................... 5-118667

[51] Int. Cl.$^6$ ................... G06F 17/00
[52] U.S. Cl. ................... 364/491; 250/492.22
[58] Field of Search ........... 250/492.2, 492.22, 250/492.23, 429.3; 364/491; 430/296

[56] References Cited

U.S. PATENT DOCUMENTS

| | | | |
|---|---|---|---|
| 4,426,584 | 1/1984 | Bohlen et al. | 250/492.2 |
| 4,504,558 | 3/1985 | Bohlen et al. | 250/492.2 X |
| 4,520,269 | 5/1985 | Jones | 250/492.2 |
| 4,789,945 | 12/1988 | Niijima | 250/492.2 X |
| 5,008,553 | 4/1991 | Abe | 250/492.2 |
| 5,051,598 | 9/1991 | Ashton et al. | 250/492.2 |
| 5,082,762 | 1/1992 | Takahashi | 430/296 |
| 5,086,398 | 2/1992 | Moriizumi | 250/492.2 X |
| 5,182,718 | 1/1993 | Harafuji et al. | 250/492.3 X |
| 5,210,696 | 5/1993 | Yano | 250/492.2 X |
| 5,253,182 | 10/1993 | Suzuki | 250/492.3 X |
| 5,432,714 | 7/1995 | Chung et al. | 250/492.2 X |
| 5,438,207 | 8/1995 | Itoh et al. | 250/492.23 |
| 5,451,487 | 9/1995 | Abe et al. | 430/296 |

*Primary Examiner*—Edward R. Cosimano
*Attorney, Agent, or Firm*—Staas & Halsey

[57] ABSTRACT

A method for processing exposure data corresponding to a pattern formed on a wafer includes the steps of (a) generating electron dose data relating to exposure per each pattern in an area to be exposed, (b) calculating exposure distance data which shows a degree to correct the electron dose data based on positional relations of each pattern as a pattern to be corrected in sequence with patterns in a predetermined range in the periphery thereof, based on the electron dose data determined by the step (a), (c) correcting the electron dose data determined by the step (a) with the exposure distance data determined by the step (b) to generate corrected electron dose data of each pattern, and (d) calculating an irradiation amount of each pattern based on the corrected electron dose data.

8 Claims, 31 Drawing Sheets

FIG. 4
PRIOR ART

| STATE OF CIRCUIT PATTERN | SPARSE ← | | | → | DENSE |
|---|---|---|---|---|---|
| ELECTRON DOSE RATIO (%) OF EACH MESH | 0.01 ~ 20.00 | 20.01 ~ 40.00 | 40.01 ~ 60.00 | 60.01 ~ 80.00 | 80.01 ~ 100.00 |
| EXPOSURE STAGES OF ELECTRON DOSE | 1 | 2 | 3 | 4 | 5 |
| RATIO OF BASIC IRRADIATION AMOUNT | 1.800 | 1.600 | 1.400 | 1.200 | 1.000 |
| IRRADIATION LUMINOUS ENERGY | STRONG ← | | | → | WEAK |

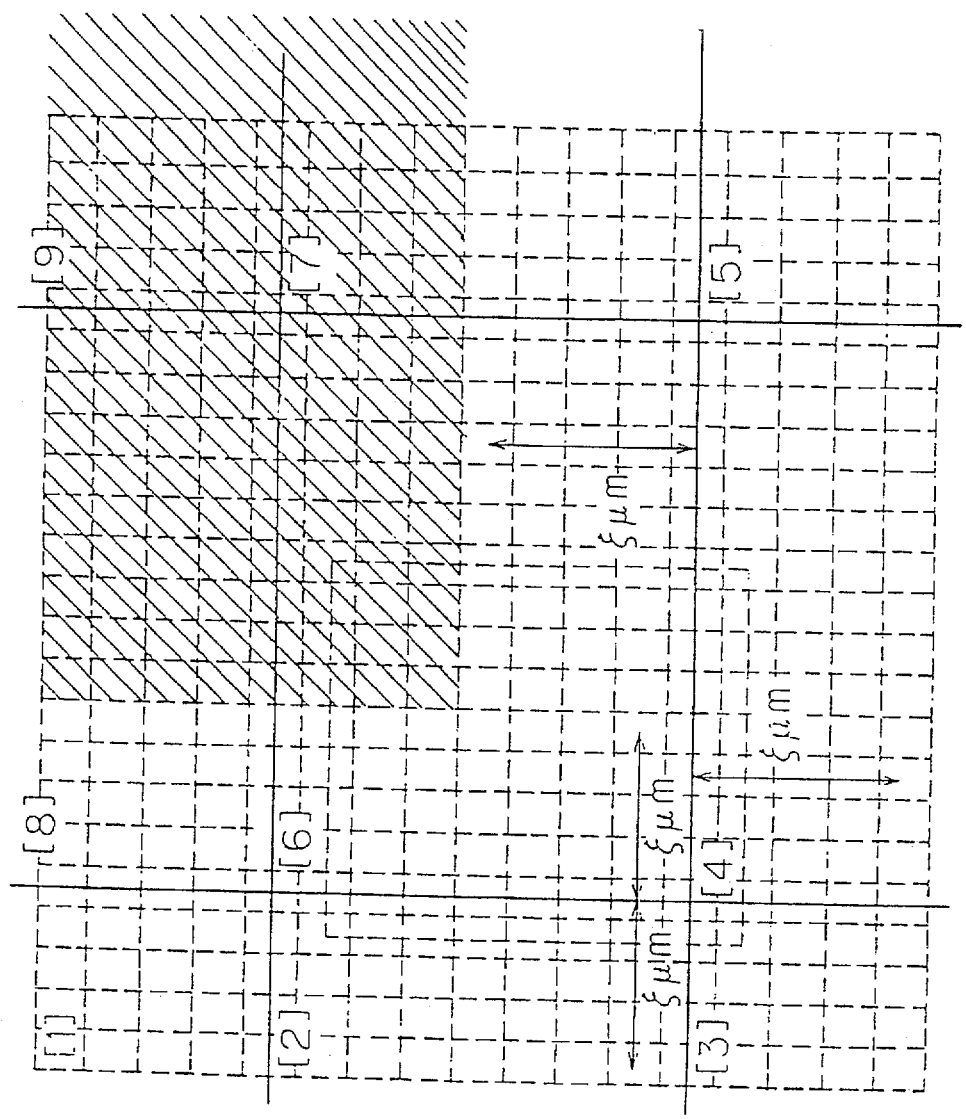

SUBFIELD BOUNDARY

FIG. 16

| STAGES OF EXPOSURE DISTANCE | ①(1) | ②(2) | ⑦(3) | ③(4) | ⑧(5) | ④(6) |
|---|---|---|---|---|---|---|
| PROPORTION OF ELECTRON DOSE RATIO | 1.000 | 0.900 | ②×A | 0.7000 | ③×A | 0.5000 |
| STAGES OF EXPOSURE DISTANCE | ⑤(7) | ⑨(8) | ⑥(9) | ⑩(10) | ⑪(11) | |
| PROPORTION OF ELECTRON DOSE RATIO | 0.3000 | ④×A | 0.1000 | ⑤×A | ⑥×A | |

FIG. 18

| 1 | 2 | 3 | 4 | 5 | 6 | 7 | 8 | 9 | 10 | 11 |
|---|---|---|---|---|---|---|---|---|----|----|
| PART OF ① | LINE SEGMENT a ② | LINE SEGMENT b ② | LINE SEGMENT a ③ | LINE SEGMENT b ③ | LINE SEGMENT a ④ | LINE SEGMENT a ⑤ | LINE SEGMENT b ④ | LINE SEGMENT a ⑥ | LINE SEGMENT b ⑤ | LINE SEGMENT b ⑥ |

FIG. 19

(TAKING-IN AREA FOR PATTERN DATA PA)

| ⑪ | ⑥ | ⑥ | ⑥ | ⑥ | ⑥ | ⑥ | ⑥ | ⑥ | ⑥ | ⑥ | ⑪ |
|---|---|---|---|---|---|---|---|---|---|---|---|
| ⑥ | ⑩ | ⑤ | ⑤ | ⑤ | ⑤ | ⑤ | ⑤ | ⑤ | ⑤ | ⑩ | ⑥ |
| ⑥ | ⑤ | ⑨ | ④ | ④ | ④ | ④ | ④ | ④ | ⑨ | ⑤ | ⑥ |
| ⑥ | ⑤ | ④ | ⑧ | ③ | ③ | ③ | ③ | ⑧ | ④ | ⑤ | ⑥ |
| ⑥ | ⑤ | ④ | ③ | ⑦ | ② | ② | ⑦ | ③ | ④ | ⑤ | ⑥ |
| ⑥ | ⑤ | ④ | ③ | ② | ① | ① | ② | ③ | ④ | ⑤ | ⑥ |
| ⑥ | ⑤ | ④ | ③ | ② | ① | ① | ② | ③ | ④ | ⑤ | ⑥ |
| ⑥ | ⑤ | ④ | ③ | ② | ① | ① | ② | ③ | ④ | ⑤ | ⑥ |
| ⑥ | ⑤ | ④ | ③ | ② | ① | ① | ② | ③ | ④ | ⑤ | ⑥ |
| ⑥ | ⑤ | ④ | ③ | ⑦ | ② | ② | ⑦ | ③ | ④ | ⑤ | ⑥ |
| ⑥ | ⑤ | ④ | ⑧ | ③ | ③ | ③ | ③ | ⑧ | ④ | ⑤ | ⑥ |
| ⑥ | ⑤ | ⑨ | ④ | ④ | ④ | ④ | ④ | ④ | ⑨ | ⑤ | ⑥ |
| ⑥ | ⑩ | ⑤ | ⑤ | ⑤ | ⑤ | ⑤ | ⑤ | ⑤ | ⑤ | ⑩ | ⑥ |
| ⑪ | ⑥ | ⑥ | ⑥ | ⑥ | ⑥ | ⑥ | ⑥ | ⑥ | ⑥ | ⑥ | ⑪ |

(TAKE-IN AREA FOR PATTERN PA)

FIG. 22A

| 3 1 | 3 2 | 3 3 | 3 4 | 3 5 | 3 6 |
| 2 5 | 2 6 | 2 7 | 2 8 | 2 9 | 3 0 |
| 1 9 | 2 0 | 2 1 | 2 2 | 2 3 | 2 4 |
| 1 3 | 1 4 | 1 5 | 1 6 | 1 7 | 1 8 |
| 7 | 8 | 9 | 1 0 | 1 1 | 1 2 |

MATRIX ARRANGEMENT INFORMATION
(WHICH ACTUALLY EXISTS)

| MATRIX PATTERN NO. (1) | | (2) | (N) |
|---|---|---|---|
| SHAPE CODE OF PATTERN | | | |
| STARTING COORDINATE X | | | |
| STARTING COORDINATE Y | | | |
| PATTERN WIDTH W | | | |
| PATTERN LENGTH H | | | |
| X-DIRECTION PITCH | Y-DIRECTION PITCH | | |
| NUMBER IN X DIRECTION | NUMBER IN Y DIRECTION | | |

FIG. 25

| STAGES OF SPARSE /DENSE RELATIONS | 5 | 4 | 3 | 2 | 1 |
|---|---|---|---|---|---|
| DISTRIBUTION OF RATIOS OF ELECTRON DOSE | 0.00% OR HIGHER LESS THAN 31.54% | 31.54% OR HIGHER LESS THAN 45.73% | 45.73% OR HIGHER LESS THAN 60.01% | 60.01% OR HIGHER LESS THAN 74.29% | 74.29% OR HIGHER |
| PROPORTION OF BASIC IRRADIATION DOSE | 1.80 | 1.60 | 1.40 | 1.20 | 1.00 |

FIG. 27B

| DATA FORMAT | MATCHED PATTERN NUMBER | MATRIX REFERENCE PATTERN | NUMBER OF PATTERNS EXTENDED IN X & Y |
|---|---|---|---|
| INDIVIDUAL PATTERN | ⑬ | NONE | NONE |
| MATRIX PATTERN | ㉑, ㉒, ㉓, ㉔, ㉕,<br>①, ②, ③, ④, ⑤ | ㉑ | 5 IN X, 2 IN Y |
| MATRIX PATTERN | ⑯, ⑳, ⑪, ⑮,<br>⑥, ⑩ | ⑯ | 2 IN X, 3 IN Y |
| MATRIX PATTERN | ⑦, ⑧, ⑨, ⑰,<br>⑱, ⑲ | ⑰ | 3 IN X, 2 IN Y |
| MATRIX PATTERN | ⑫, ⑭ | ⑫ | 2 IN X, 1 IN Y |

EXPOSURE DATA PROCESSING METHOD AND DEVICE

BACKGROUND OF THE INVENTION

1. Field of the Invention

The present invention relates to a method and a device for processing exposure data and, more particularly to a method and a device for processing the exposure data which form and process exposure pattern data for baking a pattern on the wafer with charged particle beams.

Recently, for example in the production of LSI masks, it is a general method to use an exposure device employing charged particle beams, such as electron beams.

The exposure device bakes a pattern in the area to be exposed on the wafer with charged particle beams by using predetermined exposure pattern data. The area to be exposed on the wafer is divided into areas having a predetermined size, which are called fields, and each field is divided into areas having a predetermined size, which are called subfields. Furthermore, LSI design data has the arrangement information for the kinds of data, either of an independently arranged portion which is present in the subfield and arranged independently, or of matrix arranged portions which are arranged plurally and continuously per one subfield with the same data, and the positional information containing information concerning the number of arrangement, the arranged numbers, and the range to be arranged. In order to get the exposure pattern data necessary for the exposure device from such LSI design data, there have been proposed various processing methods of the exposure data for correcting and processing the LSI design data.

The correction process is classified broadly into an exposure (irradiation amount) correction and a size correction. However, as LSI has a large capacity and is highly functional, the process time of the computer becomes substantially long, and there is a possibility of not being able to process with a large scale memory type or a large scale logic type. Therefore, it is required that the correction process of LSI design data has to be made with high speed.

The present invention relates mainly to the exposure correction.

2. Description of the Prior Art

FIG. 1 is a view showing the structure of a chip. In the conventional method for processing the exposure data, the area to be exposed of a chip (or a wafer) 10 is divided into a field 12 having a predetermined size. In FIG. 1, in order to simplify the description, the area to be exposed of the chip 10 is divided into two fields in the X direction and three fields in the Y direction, for a total of six fields 12. Each field 12 is divided into subfields 14 each having a predetermined size. In the example of FIG. 1, each field 12 is divided into plural subfields 14, eleven subfields in each of the X direction and the Y direction.

The area to be exposed is broadly classified into a matrix arranged portion 16 and an independently arranged portion 18. In the matrix arranged portion 16, the identical patterns are arranged repeatedly per each subfield unit. For example, memory cell arrays are formed in this matrix arranged portion 16. The independently arranged portion is present in each subfield unit, and is distinguished from the matrix pattern which has a regularity, repeating per each subfield unit. In the example of FIG. 1, one matrix arranged portion 16 is arranged in each of four fields.

In the conventional method for processing the exposure data, a map 20 shown in FIG. 2 is hypothetically formed in each subfield. The map 20 is composed of plural small areas (mesh) of $\phi\mu m$ in vertical and horizontal directions (X and Y directions). The map 20 centers on the center X of the objective subfield (a subfield being considered), and includes the range of the periphery of $\mu m$ of the objective subfield. About the periphery of the objective subfield shown in FIG. 2, adjacent subfields are arranged. Each adjacent subfield is located in the adjacent field or in the same field to which the objective subfield belongs.

The wider range than the objective subfield is set so as to prevent that an inconsistency of the exposure with the adjacent subfields is caused on the boundary, or in the proximity, of the objective subfield, considering the influences of the periphery of the objective subfield (proximity effect).

Now, let's assume that the objective subfield is in the independently arranged portion 16, and only two patterns A and B, shown in FIG. 3, are present. Here, pattern A is referred to as "a pattern to be corrected", and the exposure of the pattern A to be corrected is calculated as a ratio R (%) of the electron dose (electron dose) of the pattern A to be corrected by using the following formula:

$$R(\%) = \{[\Sigma(A1-A18)+\Sigma(B1-B12)+\Sigma(C1-C16)+\Sigma(D1-D4)+\Sigma(E1-E24)]/(\text{the number of maps in which patterns are actually present }(18+12+16+4+24))\} \times 100$$

Here, $\Sigma(A1-A18)$ shows the total amount of the exposure of the mesh in which the patterns A to be corrected are actually present. The same thing is applied to other patterns. The thus obtained electron dose ratio R of the pattern A to be corrected is (identical with) the electron dose ratio of each mesh contained therein.

From the electron dose ratio thus obtained, the irradiation amount is determined. For example, the electron dose ratio from 0% to 100% is divided into 5 levels of exposure intensity, and the exposure intensity level to which the obtained electron dose ratio belongs is determined. In the case of the electron dose ratio being large, the pattern is dense so that only a small amount of irradiation is required. In the case of the electron dose ratio being large, the pattern is sparse so that a large amount of irradiation is required.

FIG. 4 is a view showing the level of the exposure. The exposure intensity level is meant to be a ratio of the irradiation amount to the basic irradiation amount.

FIG. 5 shows the outermost subfield in the matrix arranged portion. In FIG. 5, [1]–[5] are subfields in the independently arranged portion, [6]–[8] are the outermost subfields in the matrix, and [9] is an inner subfield in the matrix.

FIGS. 6A and 6B are enlarged views of the part encircled by a thick line of chains in FIG. 5. In FIG. 6A, the inner subfield in the matrix [9] shown by solid oblique lines is given the maximum exposure intensity level "5", since the exposure is little. On the other hand, the area A shown by chain oblique lines is the identical pattern with the inner subfield [9] in the matrix, but due to the presence of the adjacent independently arranged subfield, the identical exposure intensity level with the inner subfield in the matrix cannot be simply set. Therefore, the exposure of each mesh in the area A is first determined as follows:

For example, in order to calculate the electron dose of mesh (1) shown in FIG. 6B, all the exposure of the map involved in the range of the periphery of $\xi\mu m$ centered on the mesh (1) is added to the exposure of the mesh (1).

The dose of exposure for

```
(1) = XY(1,1) +
XY(2,1) + XY(3,1) + XY(4,1) + XY(5,1) + XY(1,2) +
XY(2,2) + XY(3,2) + XY(4,2) + XY(5,2) + XY(1,3) +
XY(2,3) + XY(3,3) + XY(4,3) + XY(5,3) + XY(1,4) +
XY(2,4) + XY(3,4) + XY(4,4) + XY(5,4) + XY(1,5) +
XY(2,5) + XY(3,5) + XY(4,5) + XY(5,5).
```

Furthermore, all the electron doses of the map involved in the range of the periphery of ξμm centered on the mesh (2) are added to the electron dose of the mesh (2) in FIGS. 6A and 6B.

The dose of exposure for

```
(2) = XY(1,1) +
XY(2,1) + XY(3,1) + XY(4,1) + XY(5,1) + XY(6,1) +
XY(7,1) + XY(1,2) + XY(2,2) + XY(3,2) + XY(4,2) +
XY(5,2) + XY(6,2) + XY(7,2) + XY(1,3) + XY(2,3) +
XY(3,3) + XY(4,3) + XY(5,3) + XY(6,3) + XY(7,3) +
XY(1,4) + XY(2,4) + XY(3,4) + XY(4,4) + XY(5,4) +
XY(6,4) + XY(7,4) + XY(1,5) + XY(2,5) + XY(3,5) +
XY(4,5) + XY(5,5) + XY(6,5) + XY(7,5) + XY(1,6) +
XY(2,6) + XY(3,6) + XY(4,6) + XY(5,6) + XY(6,6) +
XY(7,6) + XY(1,7) + XY(2,7) + XY(3,7) + XY(4,7) +
XY(5,7) + XY(6,7) + XY(7,7).
```

Similarly, the dose of exposure for each mesh in the area A is calculated.

To each mesh of the inner subfield [9] in the matrix, the exposure intensity level "5" corresponding to the basic electron dose is set, and the maximum electron dose md in the area A is given.

Then, the electron dose ratio of each mesh in the area A to the maximum electron dose md is determined, and the exposure intensity level is calculated per each mesh referring to FIG. 4.

Since thus determined exposure intensity level is calculated based on the electron dose of only the meshes in the outermost subfield in the matrix, the influences from the adjacent independently arranged portion are not considered. FIG. 7 is a view showing the boundary portion between the independently arranged portion subfield and the outermost subfield in the matrix. In the boundary portion between the independently arranged portion subfield and the outermost subfield in the matrix, the value of the irradiation amount is not regular, being different with the inner subfield in the matrix. It is because there is no regularity of the pattern in the independently arranged portion. If only the map information concerning the above-mentioned independently arranged portions and the outermost portions in the matrix are formed, the inconsistency (discontinuity) of the electron dose will be caused on the boundary or in the proximity thereof. Therefore, the map in the range of ξμm is formed from the boundary subfield of the independently arranged portion which is adjacent to the outermost subfield in the matrix to correct the exposure intensity level.

However, the conventional method for processing the electron dose data described above has the following problems. Firstly, the electron dose ratio in each mesh of the independently arranged portion is determined by dividing the total electron dose of the patterns in the objective field of the independently arranged portion and in the periphery of ξμm thereof by the total number of meshes actually present in the objective field and the periphery of ξμm thereof. Therefore, information concerning the distance with patterns in the proximity of the pattern to be corrected is not at all considered. Therefore, the exposure intensity level obtained from the electron dose ratio does not sufficiently reflect the arrangement relationship (distance information) of the actual patterns, and accordingly it is not accurate.

Furthermore, the calculation method of the exposure intensity level of the independently arranged portion to be corrected, and that of the exposure intensity level of the outermost subfield in the matrix are different. And since the arrangement relationship of the actual patterns is not sufficiently reflected, the exposure intensity level cannot be effectively reviewed in the correction of the exposure intensity level explained by referring to FIG. 7.

SUMMARY OF THE INVENTION

The present invention is to aim at the above-mentioned conventional problems, and its object is to provide a method and a device respectively for generating electron dose data and which can generate electron dose data, which dose data is extremely accurate, by reflecting the mutual relations between patterns undergoing exposure.

In accordance with present invention and, as shown in FIG. 8, a method for processing exposure data comprises a step (a) for generating electron dose data relating to exposure, per each pattern, in an area to be exposed, step (b) for calculating exposure distance data which shows a degree of correction of the electron dose data, based on positional relations of each pattern as a pattern to be corrected in sequence with patterns in a predetermined range in the periphery thereof, based on the electron dose data determined by the step (a), step (c) for correcting the electron dose data determined by the step (a) with the exposure distance data determined by the step (b) to generate corrected electron dose data of each pattern, and step (d) for calculating an irradiation amount of each pattern based on the corrected electron dose data.

In the present invention, since the exposure distance data, which show the degree of correction of the electron dose data, are calculated based on the positional relations of each pattern as a pattern to be corrected in sequence with patterns in a predetermined range in the periphery thereof, based on the electron dose data determined by the step (a)(step (b)), and the electron dose data determined by the step (a) are corrected with the exposure distance data determined by the step (b) to form a corrected electron dose data of each pattern (step (c)), and the irradiation amount of each pattern is calculated based on the corrected electron dose data, the mutual relations between patterns can be reflected on the exposure, whereby the electron dose data which is extremely accurate can be formed.

BRIEF DESCRIPTION OF THE DRAWINGS

Other objects, features and advantages of the present invention will become more apparent from the following detailed description when read in conjunction with the accompanying drawings, in which:

FIG. 4 is a view showing the exposure intensity level of the exposure used in the conventional method for processing the electron dose data;

FIG. 5 is a view showing the outermost subfield in the matrix arranged portion;

FIG. 16 is a view showing the exposure distance map;

FIG. 18 is a view explaining the method to decide the exposure distance stages;

FIG. 19 is a view showing the exposure distance stages given to each mesh in the taking-in area of the objective pattern and the periphery thereof;

FIG. 20 is a view showing the final electron dose ratio of each pattern in the taking-in area of the objective pattern and the periphery thereof;

FIGS. 22A, 22B and 22C are views showing the format to store information relating to the matrix pattern;

FIG. 25 is a view showing the stage of the sparse/dense relations;

FIGS. 27A and 27B are views explaining the matrix recognition process;

DESCRIPTION OF THE PREFERRED EMBODIMENTS

An embodiment of the present invention will be described in detail with reference to the accompanying drawings.

Figure 9:
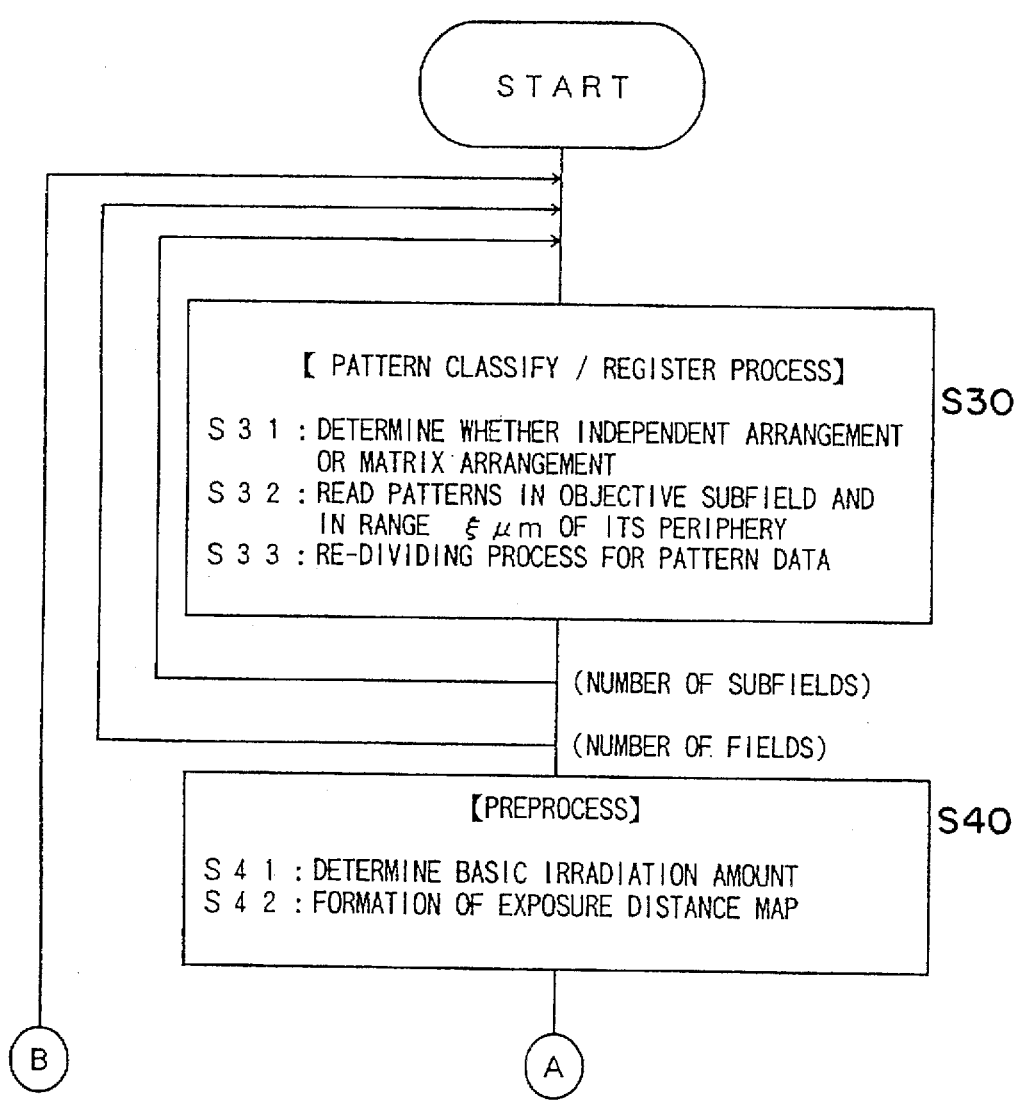
FIG. 9 is a flow chart (1) showing the structure of the method for processing the electron dose data according to one embodiment of the present invention.
Figure 10:
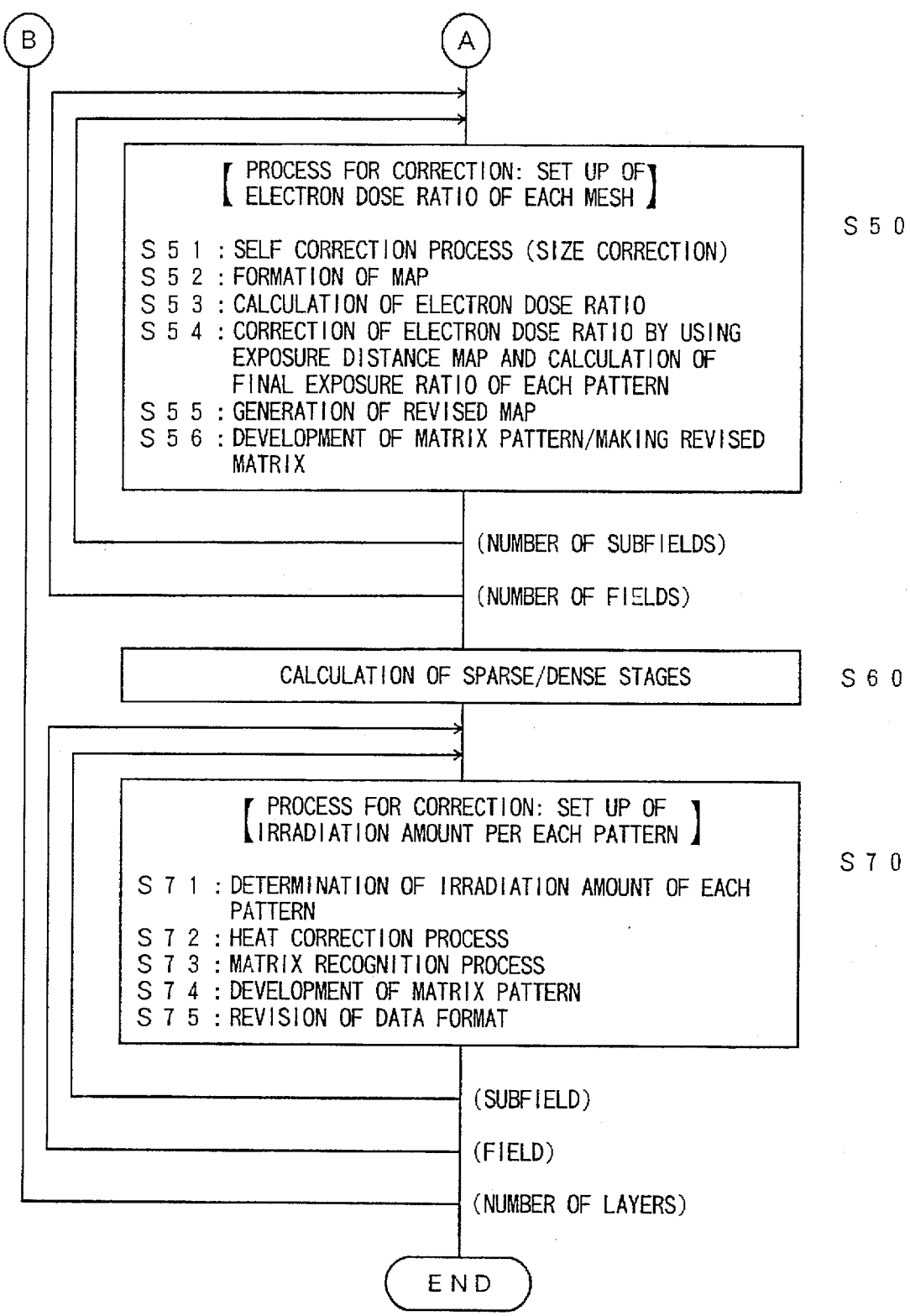
FIG. 10 is a flow chart (2) showing the structure of the method for processing the electron dose data of the present invention.

FIGS. 9 and 10 are flow charts showing a method for processing electron (exposure) dose data according to an embodiment of the present invention. As illustrated, the method for processing the electron dose data comprises a process S30 to classify/register the pattern, a preprocess S40 for correction, a process S50 for correction relating to the set up of the electron dose ratio in each mesh, a process S60 for calculating the sparse/dense stage of the pattern, and a process S70 for correction relating to the set up of the irradiation amount per each pattern.

Figure 1:
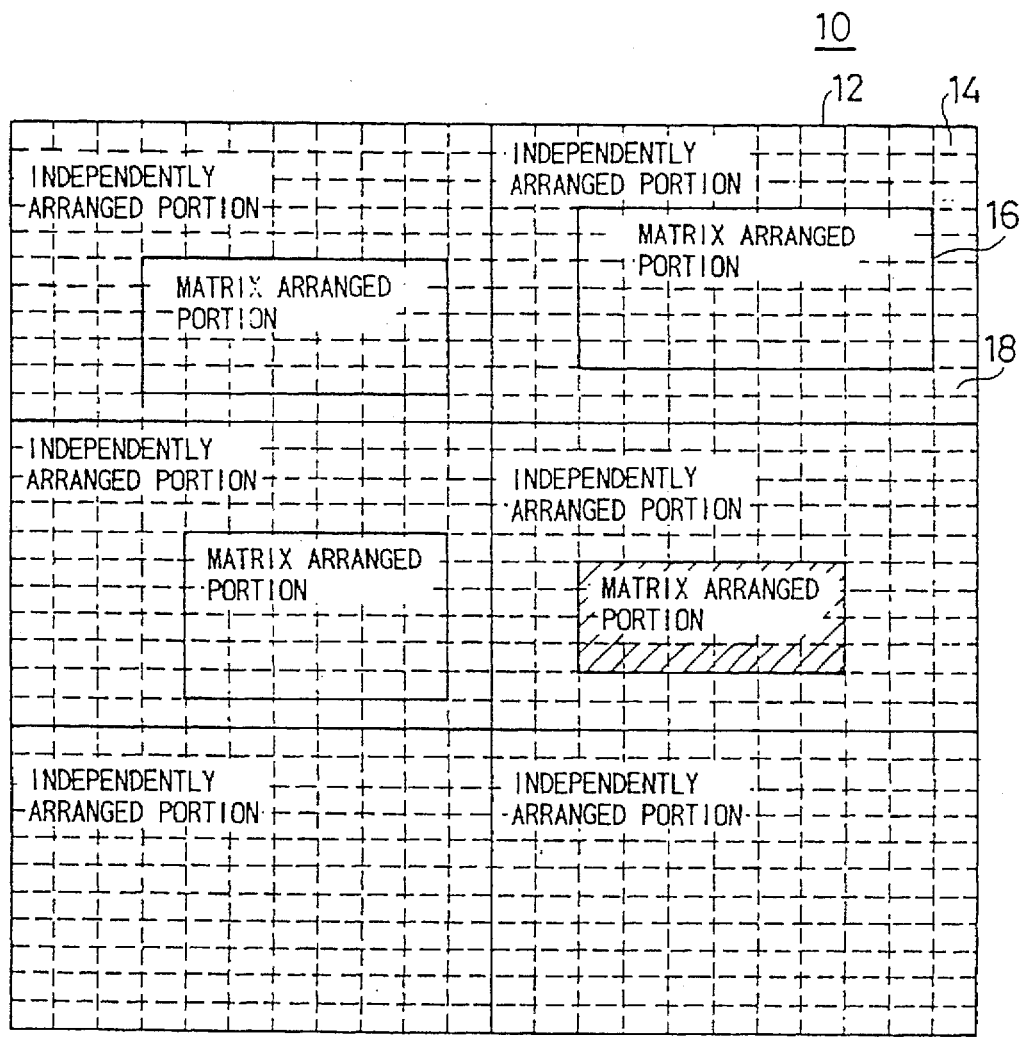
FIG. 1 is a view showing the structure of a chip.
Figure 2:
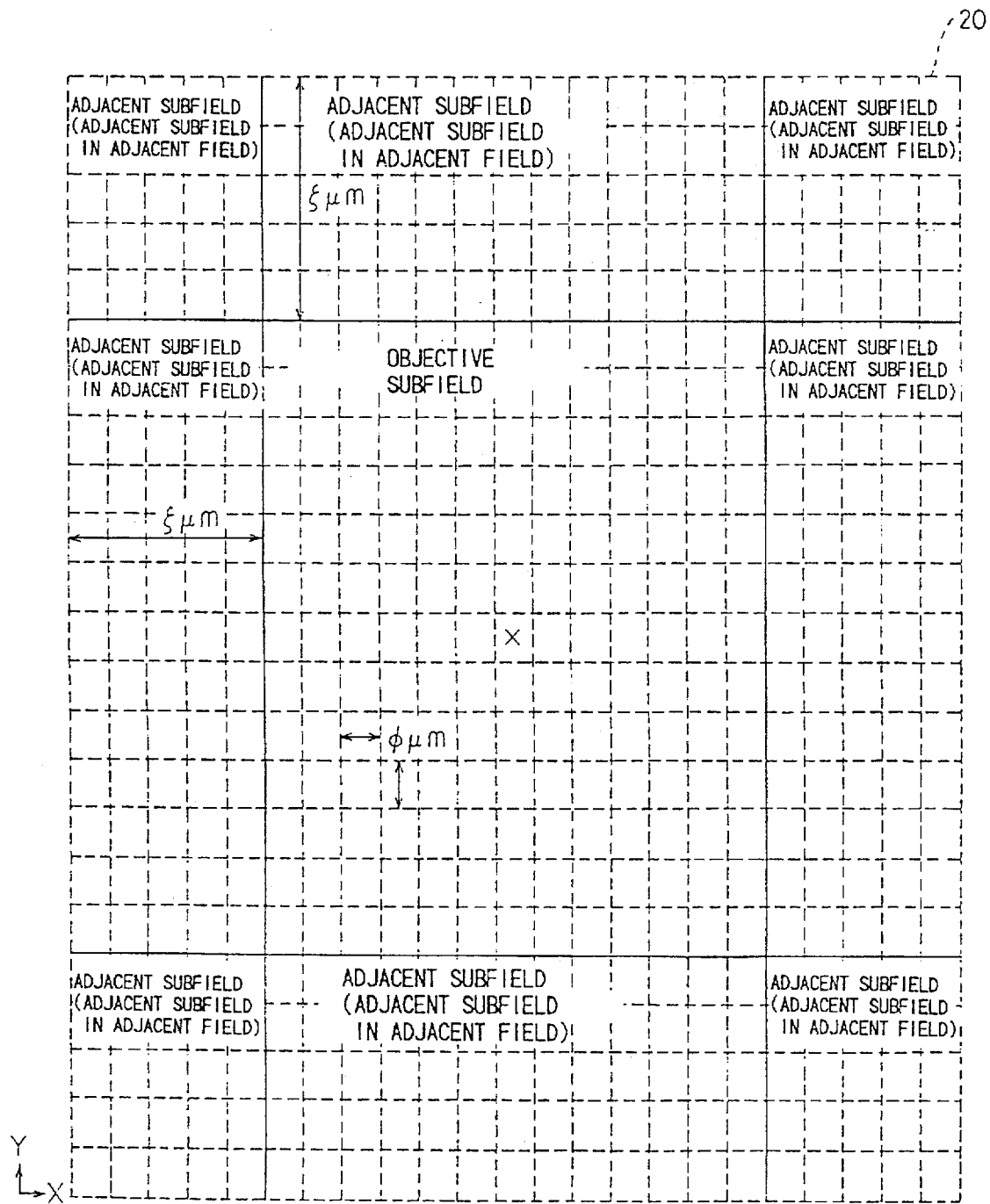
FIG. 2 is a view showing the formation method of a map in the conventional method for processing the electron dose data.
Figure 3:
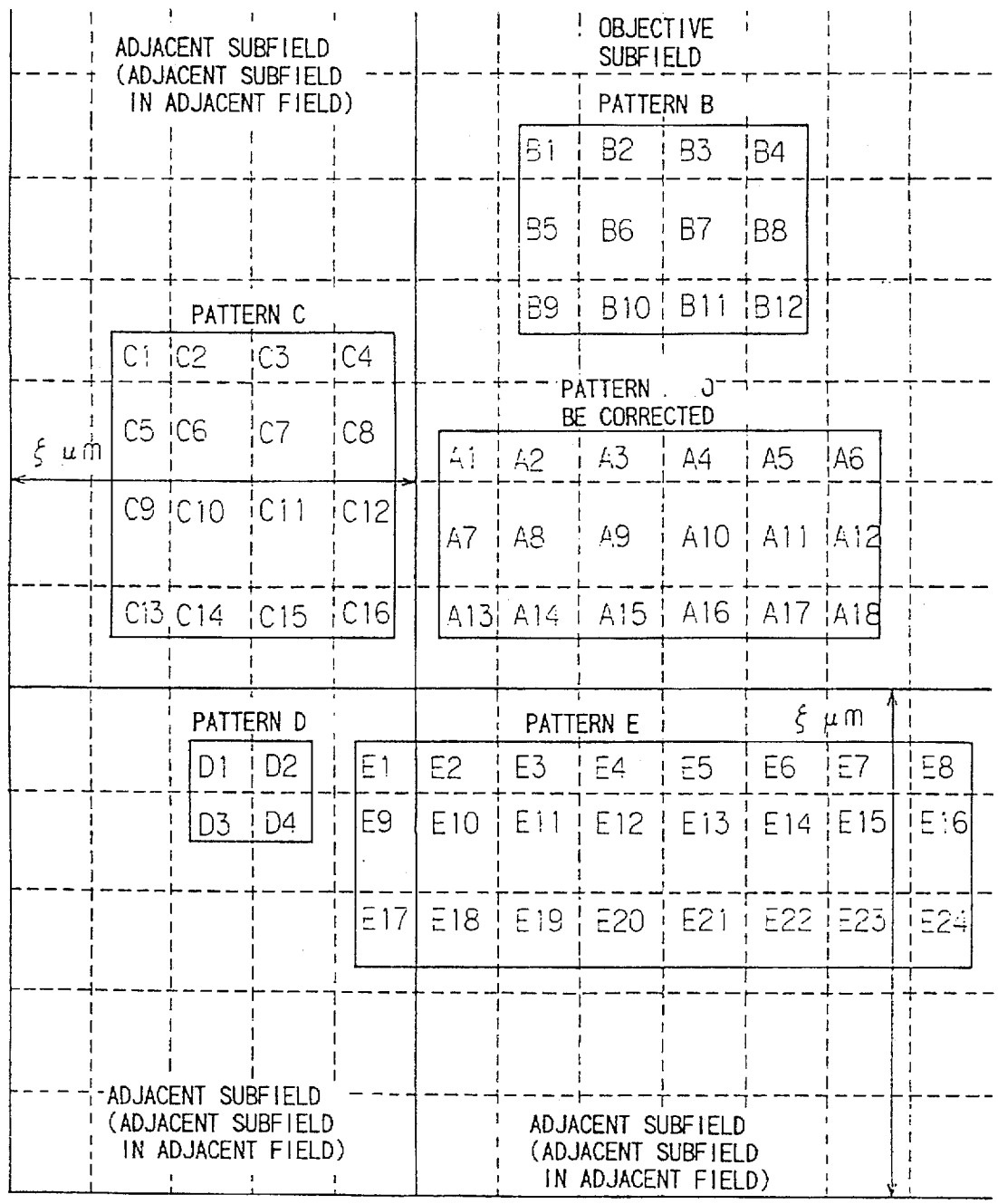
FIG. 3 is a view showing the electron dose ratio of each mesh in the independently arranged subfield in the conventional mapping process.
Figure 6A:
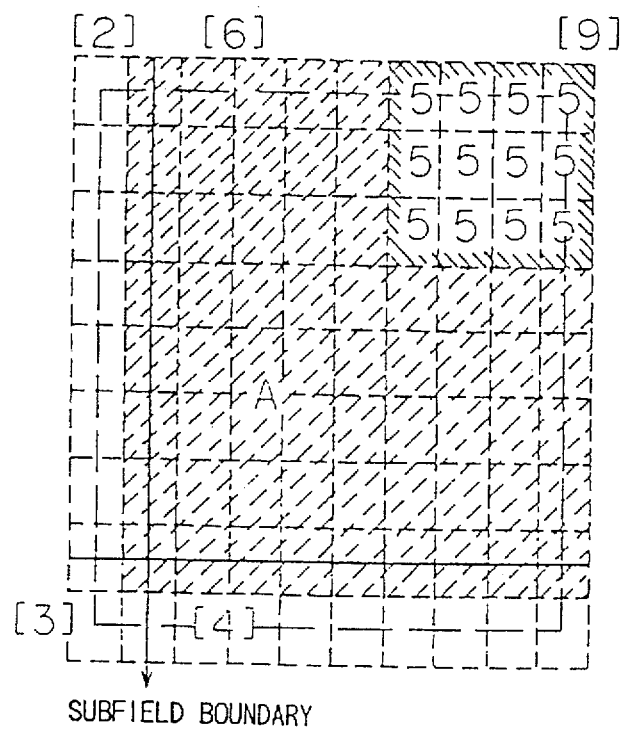
FIGS. 6A and 6B are enlarged views of the part encircled by a thick line of chains in FIG. 5.
Figure 6B:
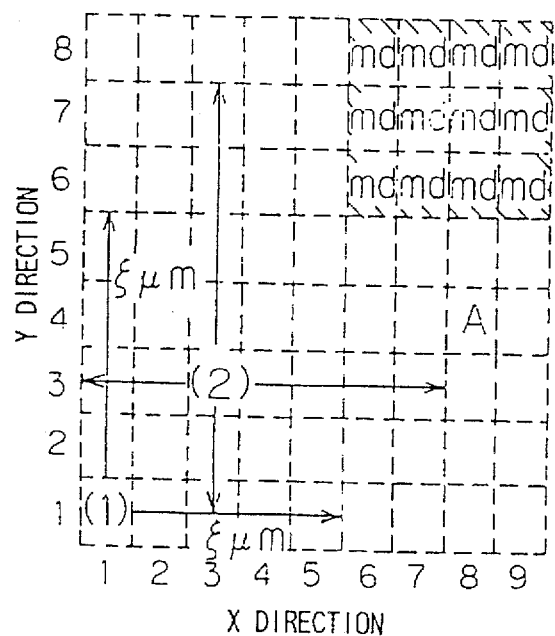

Now, let's assume that the input data relating to the chip 10 shown in FIG. 1 is to be processed. At the first step 31 of a process S30 to classify/register the pattern, the pattern data is read per each field 12 in the chip 10 and it is determined whether each subfield in each field 12 is independently arranged or matrix arranged. At the second step S32, as shown in FIG. 9, the pattern data of the subfield adjacent to the periphery of $\xi\mu m$ in the X and Y directions from the objective subfield is registered with the pattern data in the objective subfield as the pattern data relating to the objective subfield. At this registration, the pattern data in the objective subfield is registered as the pattern data to be corrected, and the pattern data in the periphery of said $\xi\mu m$ is registered as the pattern data outside the range to be corrected. However, the pattern data outside the range to be corrected is used only for reference for the calculation of the exposure of the objective subfield, and not to be corrected. Incidentally, the map 20 shown in FIG. 2 is not formed at the process S30 to classify/register the pattern. Moreover, at the third step S33, the conventional re-dividing process of the pattern data is carried out, according to need.

The process S30 to classify/register the pattern data mentioned above is performed for all subfields in all fields.

After completion of the process S30 to classify/register the pattern, the preprocess S40 for the correction is carried out. At the first step S41 of the preprocess S40, the basic irradiation amount is set, and at the second step S42, the exposure distance map is formed. The exposure distance map will be described later.

Then, the process S50 (FIG. 10) for correction relating to the set up of the electron dose ratio in each mesh is carried out. At the first step S51 of the correction process, the self correction process (correction of size) of the pattern data to be corrected in one subfield is carried out. The self correction process is a known technique, and is not directly related to the purport of the present invention, therefore the detailed description is omitted.

In the second step S52, as is shown in FIG. 10, the map 20 is formed in the objective subfield and in the range of the periphery of $\xi\mu m$ in X and Y directions. The objective subfield is in the subfield in the independently arranged portion or in the outermost subfield in the matrix. For the inner subfield in the matrix of the outermost subfield in the matrix, such a map, as includes the range of the periphery of $\xi\mu m$ in X and Y directions is not formed.

At the third step S53, the pattern data in the thus formed is read per the objective subfield to calculate the electron dose ratio, and is set in each mesh. For the subfield in the independently arranged portion and the outermost subfield in the matrix, all the pattern data included in the map 20 are read. The set up of the electron dose ratio is carried out for all meshes in which the pattern is present. The electron dose ratio set up per mesh corresponds to, for example, the ratio of the surface area of the pattern which is occupied in one mesh.

Figure 11:
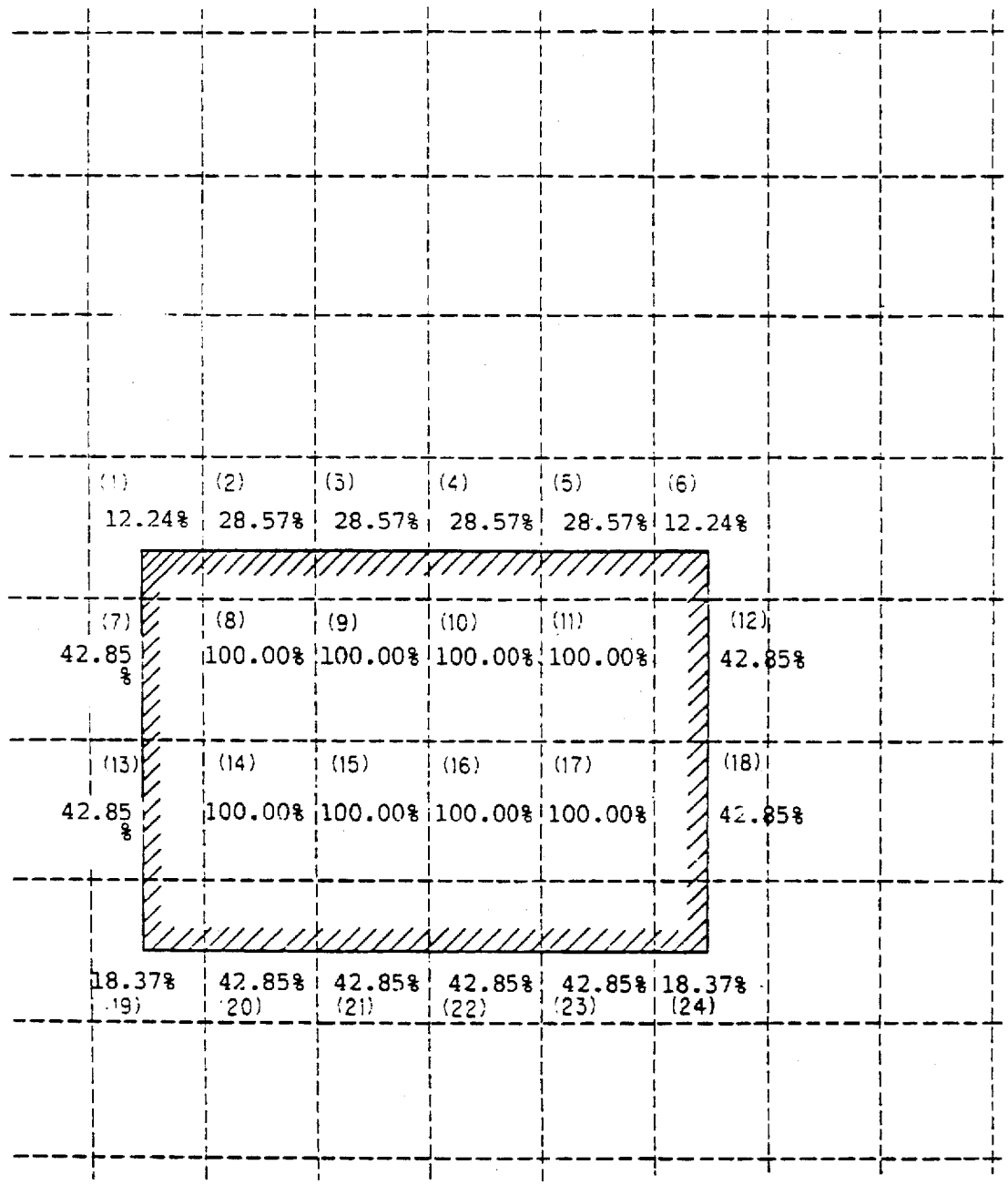
FIG. 11 is a view showing a pattern in the objective subfield in the independently arranged portion to which the mapping process is applied.

FIG. 11 shows a pattern in the objective subfield in the independently arranged portion to which the mapping process is applied. In FIG. 11, linear lines shown by a dotted line in X and Y directions show the map. (1) to (24) in FIG.

11 show the mesh, and the percentage numerical values show the electron dose ratio. For example, the electron dose ratio of mesh (1) is 12.24%.

In the process for determining the electron dose ratio per mesh described above, the pattern data is not actually divided (divided into 24 in the example of FIG. 11). If the pattern data is actually divided, the number of the pattern data becomes enormous. Therefore, the pattern data is not divided, but it is determined to which mesh the pattern belongs, and the electron dose ratio is set up for each mesh (1) to (24), as shown in FIG. 11. Such a process is referred to as "a provisional map-dividing process".

Figure 12:
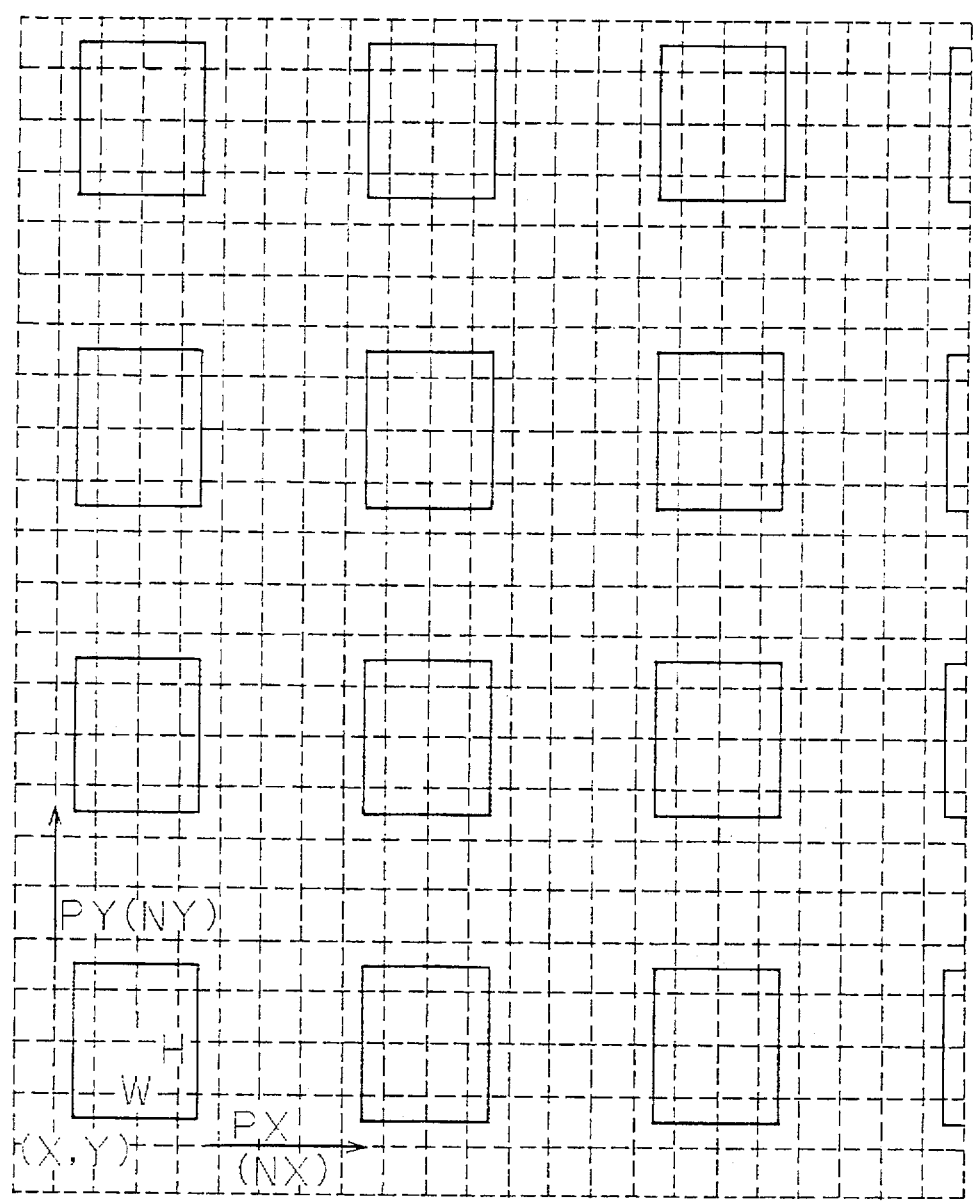
FIG. 12 is a view explaining the calculation of the exposure of the matrix pattern.

Furthermore, with regard to the matrix pattern data in the matrix arranged subfield, patterned is not developed, and the electron dose ratio is calculated by using the arrangement information of the matrix pattern present in the pattern data, as shown in FIG. 12. At the time of input of the matrix pattern data, the following arrangement information of the matrix pattern is set:

X coordinate and Y coordinate at the starting point of the pattern (X, Y);

Pattern width W and pattern length H

Repeat pitch PX (in X direction) and PY (in Y direction) of the pattern data; and Repeat number NX (in X direction) and NY (in Y direction) of the pattern data.

By using the arrangement information of the matrix pattern, the provisional map-dividing process is carried out as in the individual pattern data described in FIG. 11, and the electron dose ratio of the pattern is determined per mesh.

The electron dose ratio of the pattern in the matrix arranged portion 16 is determined by the different method with the calculation method of the electron dose ratio of the pattern in the independently arranged portion. As shown by an oblique line in FIG. 1, the subfield located in the outermost periphery of the matrix arranged portion (the outermost field in the matrix) is adjacent to the independently arranged portion 18. The above-mentioned map is formed provisionally, centering on each outermost subfield in the matrix. Incidentally, the map is not formed for each subfield in the outermost subfield in the matrix (the inner subfield in the matrix). This is because the pattern having a regularity is arranged in this subfield and there is little difference of the exposure. Since the outermost subfield in the matrix is affected by the adjacent independently arranged portion, the map is formed.

Figure 13:
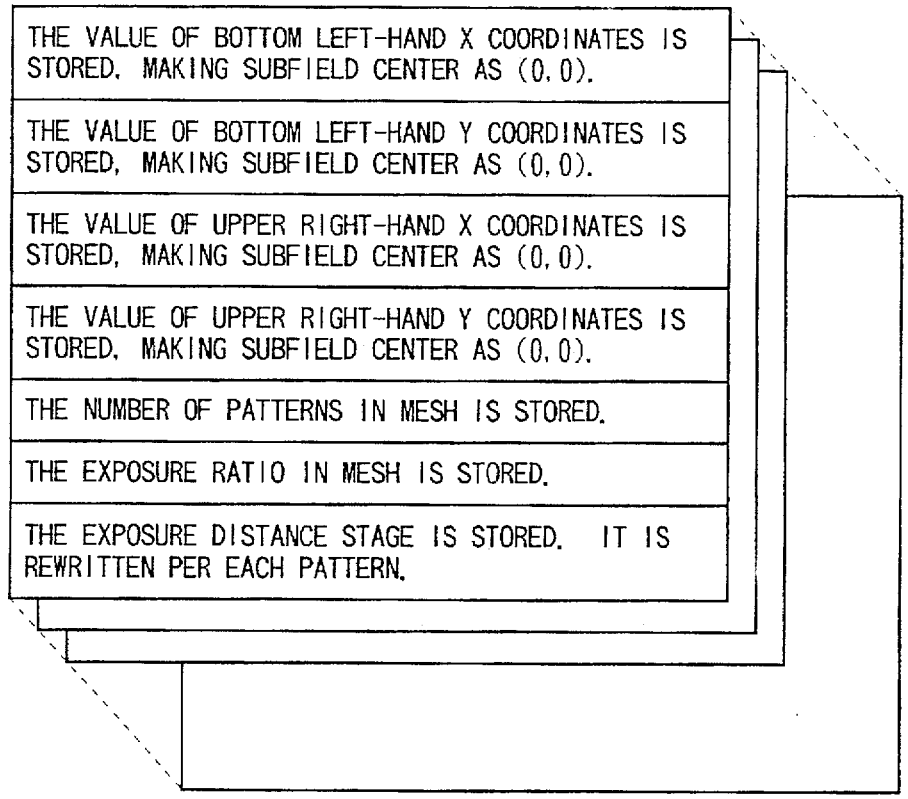
FIG. 13 is a view showing the format which stores information per each mesh.

The electron dose ratio of the pattern of the independently arranged portion determined by the above-mentioned provisional map-dividing process and the electron dose ratio of the pattern of the matrix arranged portion are stored as map information in the subfield shown in FIG. 13. The map information includes the values of X and Y coordinates at the bottom left of the mesh and X and Y coordinates at the top right of the mesh, making the center of the objective subfield as (0,0), the number of patterns in the mesh and the electron dose ratio in the mesh. Incidentally, the exposure distance stages defined by the exposure distance map shown in FIG. 13 will be described later.

Figure 14:
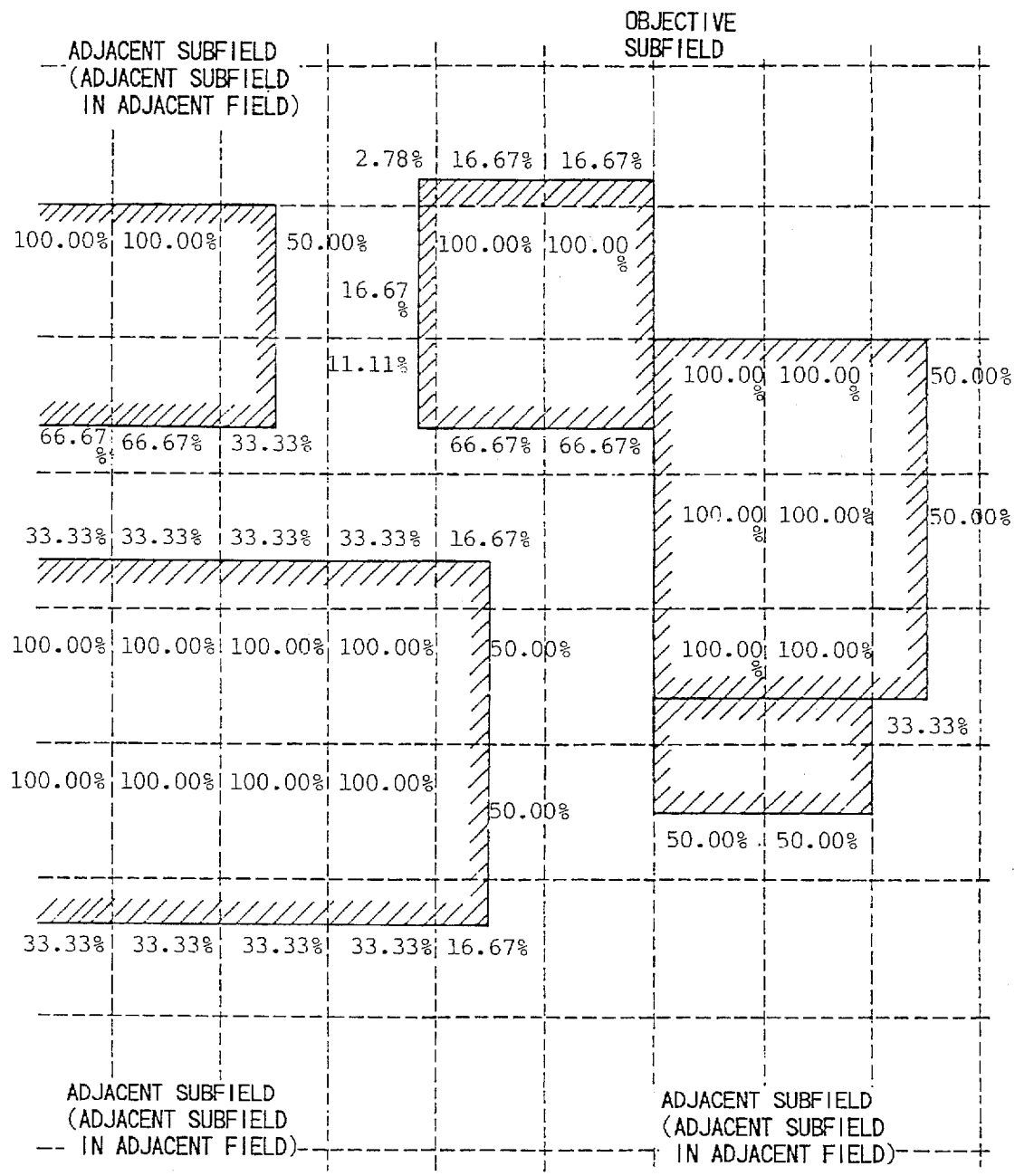
FIG. 14 is a view showing the ratio of the map in a subfield and the exposure.

FIG. 14 shows the information of the ratio of exposures and meshes of the map obtained by repeating the times of pattern data numbers (total number of patterns to be corrected and patterns outside the range to be corrected) in one subfield. Incidentally, FIG. 14 shows a part of bottom left of the objective subfield. With regard to the pattern data in the objective subfield and the pattern data in the adjacent subfield (of the same field or of the adjacent field), it is decided to which position on the mesh they belong; then, the electron dose ratio of each mesh is set. The number in each mesh shows the electron dose ratio.

Then, at the step S54 shown in FIG. 9, a process to review the electron dose ratio is carried out by utilizing the exposure distance map.

Figure 15:
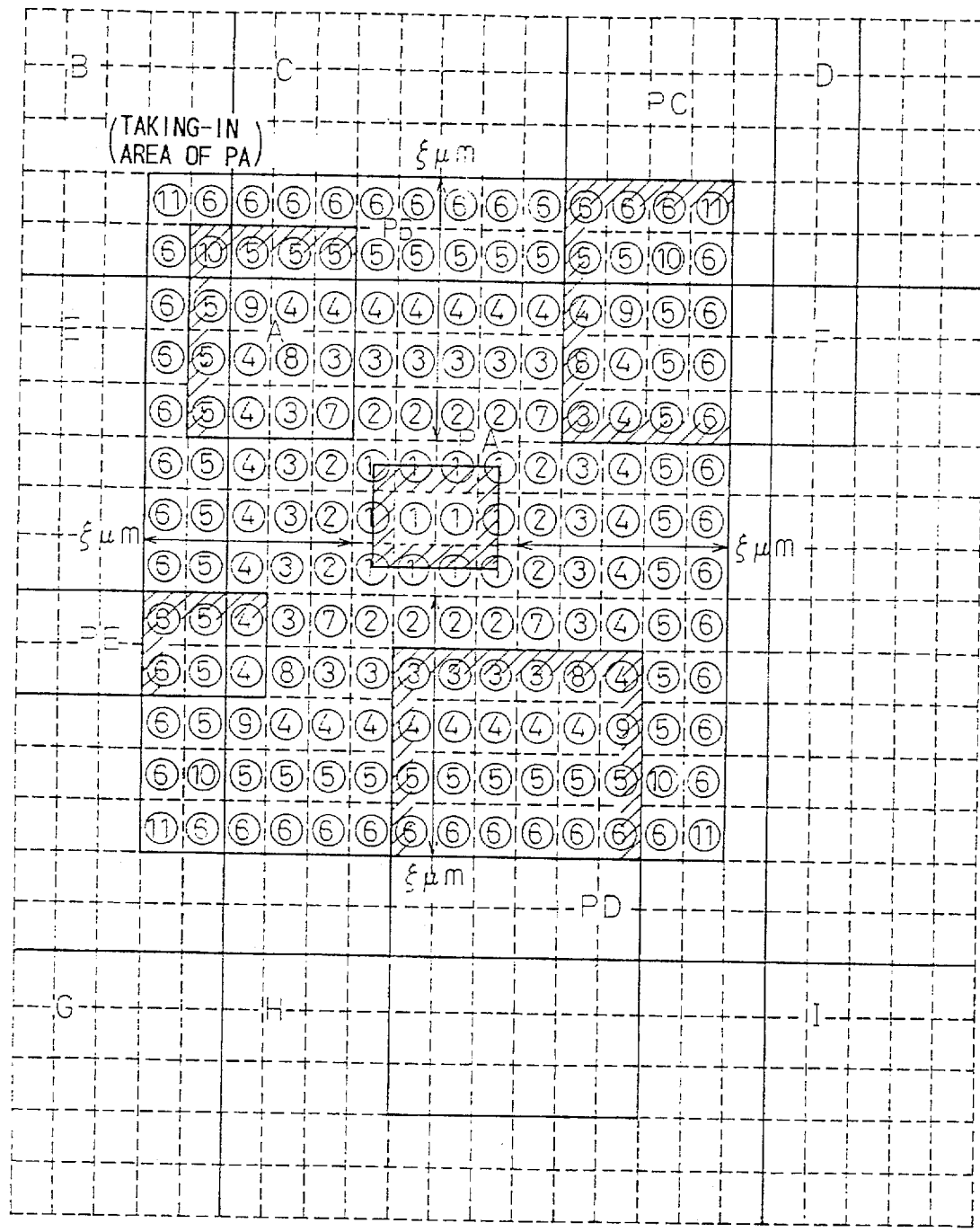
FIG. 15 is a view showing the relation between each mesh and the exposure distance map.

FIG. 15 is a view showing the relations between each mesh and the exposure distance stages. More particularly, FIG. 15 shows the objective subfield, and B–I show the adjacent subfields. The encircled numbers show the exposure distance stages. Now, the pattern PA to be corrected in the objective subfield and patterns in the mesh in the area of its periphery of ξμm are extracted. Incidentally, the above-mentioned periphery of ξμm is measured from the mesh where the pattern to be corrected is present. In the drawing, in the area of the periphery of ξμm, there are included all meshes included in pattern PB and a part of meshes included in pattern PC, PD and PE. In each mesh in the taking-in area of pattern PA, the exposure distance stages which are defined by the exposure distance map described below are set. Based on the exposure distance stages in each map and the electron dose ratio, the electron dose ratio of pattern PA is reviewed.

FIG. 16 is a view showing the exposure distance map. In the drawing, the exposure distance stages are expressed by encircled numbers, and the number in brackets shows the order of the length of the physical distance (based on the mesh) from the pattern to be corrected (pattern in FIG. 15). Incidentally, the distance (1) corresponds to a mesh in the objective pattern. The proportion of the electron dose ratio means the degree to be reviewed of the electron dose ratio based on the mesh determined by the above-mentioned process. A in FIG. 16 means 1/square root 2.

Figure 17:
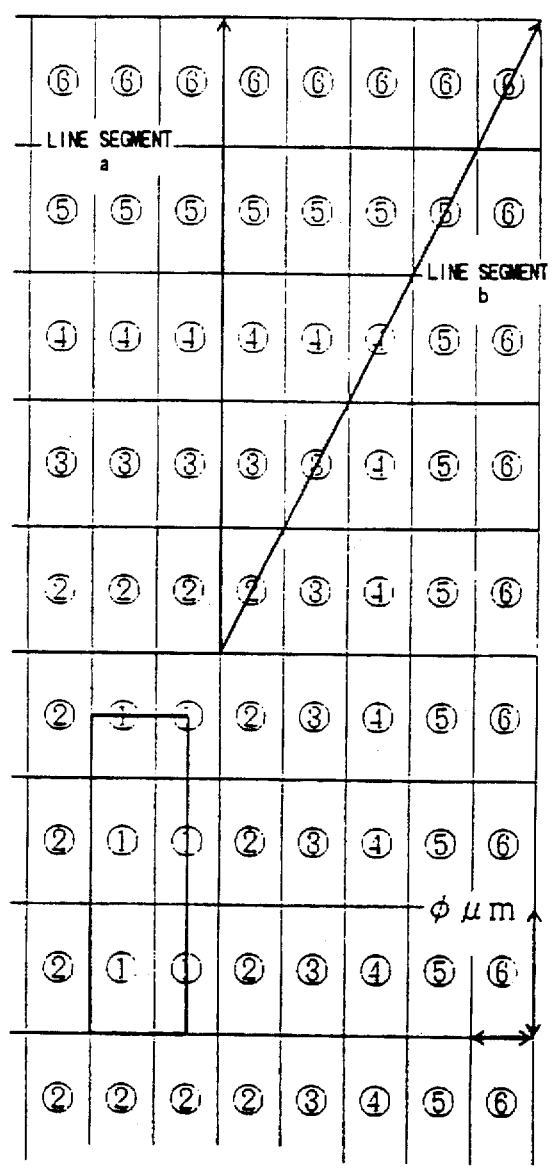
FIG. 17 is a view explaining the calculation method of the exposure distance map.

The review of the electron dose ratio is carried out, based on the exposure distance stages, by multiplying the electron dose ratio of each mesh included in the taking-in area of the pattern data to be corrected by the proportion of the electron dose ratio, and the electron dose ratio is corrected (reviewed) corresponding to the distance information per each mesh. The exposure distance map is determined as follows. FIG. 17 is a view showing a part taking in a mesh in the range of the periphery of ξμm from each mesh which belongs to the pattern to be corrected. Incidentally, the shape of each mesh can be set optionally, but here it is to be a square with a side ξμm long. The exposure distance map in FIG. 16 is formed at the following processes 1 to 4.

At process 1, 5 stages of the exposure distance are provisionally set to each mesh in the map area having a periphery of ξμm, as shown in FIG. 17. The exposure distance stages in the X and Y directions and the diagonal direction in the drawing are set so as to increase, one each, from 2 to 6 based on the mesh. Incidentally, the exposure distance stage given to each mesh in the pattern to be corrected is 1.

At process 2, the mesh on the line segment b in FIG. 17 is identified. The length of the line segment b is square root 2 times the length of a line segment a in the Y direction in FIG. 17.

At process 3, the exposure distance stages for each mesh on the line segment a and the line segment b are automatically set, and the relations of the physical distance are set in order of the distance of the pattern data. Finally, the exposure distance stages will be 11 stages as shown in FIG. 18. As shown in FIG. 18, the stage of encircled 2 on the line segment a is nearest to the pattern to be corrected (exposure distance stage 1), and the stage encircled 6 on the line segment b is farthest to the pattern to be corrected (exposure distance stage 11).

At process 4, the proportion of the electron dose ratio of the mesh in the stages encircled 2 to 6 on the line segment b is determined as follows:

Percentage of the electron dose ratio of encircled 2 on the line segment=proportion of the electron dose ratio of encircled 2 on the line segment a×1/square root 2

Percentage of the electron dose ratio of encircled 3 on the line segment=proportion of the electron dose ratio of encircled 3 on the line segment a×1/square root 2

Percentage of the electron dose ratio of encircled 4 on the line segment=proportion of the electron dose ratio of encircled 4 on the line segment a×1/square root 2

Percentage of the electron dose ratio of encircled 5 on the line segment=proportion of the electron dose ratio of encircled 5 on the line segment a×1/square root 2

Percentage of the electron dose ratio of encircled 6 on the line segment=proportion of the electron dose ratio of encircled 6 on the line segment a×1/square root 2

The above-mentioned processes 1 to 4 are carried out for the mesh included in the periphery of $\xi\mu m$ which belongs to the pattern data. The result is the exposure distance map shown in FIG. 16. In FIG. 16, the exposure distance stage of the mesh of which distance is thirdly near (shown by 3 in brackets) is shown in encircled 7, and the proportion of the electron dose ratio of this mesh is obtained by multiplying the proportion of the electron dose ratio of the exposure distance stage 2 (encircled) by A (=1/square root 2).

FIG. 19 shows the exposure distance stage 2 given to each mesh in the taking-in area in the periphery of $\xi\mu m$ relating to the pattern PA to be corrected (a pattern having a different shape with a pattern to be corrected in FIG. 15). In the X and Y directions, the exposure distance stage increases one by one in the range of 2 to 6 (encircled) from the pattern PA to be corrected. From four corners of pattern PA to be corrected toward the corner of the taking-in area, the exposure correction stage increases one stage each per mesh from 7 to 11 (encircled).

Figure 20:
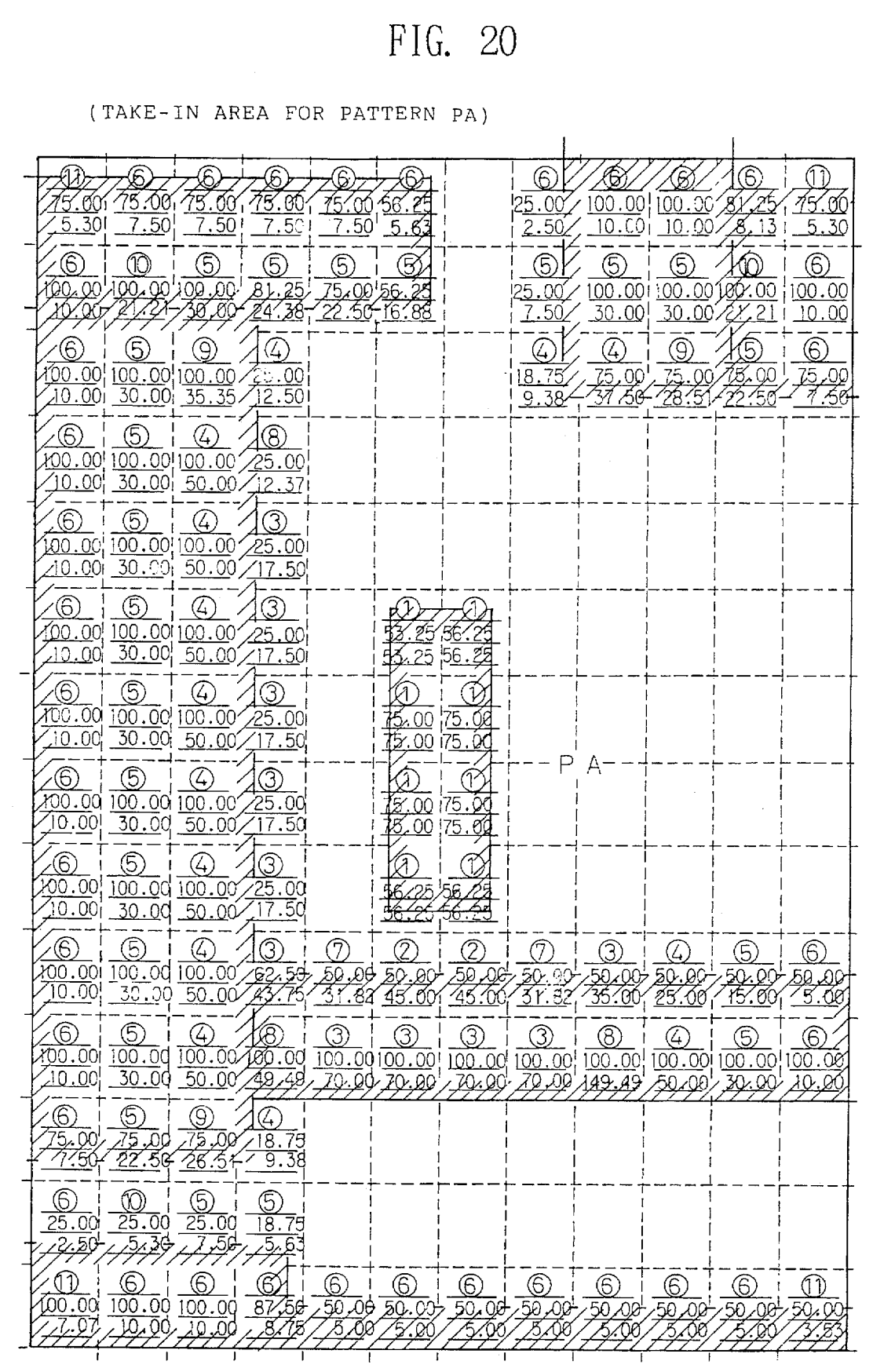

FIG. 20 is a view showing the final electron dose ratio (the electron dose ratio after the review process) of the pattern by forming the exposure distance map shown in FIG. 16. As shown in FIG. 20, there are plural patterns in the taking-in area $\xi\mu m$ of the pattern PA to be corrected. In each mesh shown in FIG. 20, the encircled number in the upper row shows the exposure distance stage, and the number in the middle row shows the electron dose ratio before the review, which is determined at process S40 in FIG. 9. Furthermore, the number in the lower row shows the electron dose ratio after the review by multiplying the electron dose ratio of the middle row by the proportion of the electron dose ratio set for each stage, which is defined by the exposure distance map. It is a matter of course from the exposure distance map of FIG. 16 that the electron dose ratios of the middle row and the lower row of each mesh in pattern PA to be corrected are identical. Furthermore, since the exposure distance stage of the mesh at the corner of the taking-in area is 11 (encircled), for example at the bottom left-hand corner of the taking-in area, the electron dose ratio which was 100% before the review is corrected to be 7.07% after the review.

Then, the final electron dose ratio of pattern PA is calculated at the step S54 of FIG. 10 as follows. That is, firstly, the numerical values of the lower row of each mesh in the taking-in area shown in FIG. 20 are added (the total value is set as A0), which is divided by the total map numbers in the taking-in area (there exist 168 meshes in FIG. 20: the total map numbers are set as B0) to determine the average electron dose ratio per one mesh. This is expressed by using the equation as follows:

Final electron dose ratio of $PA=(A0/B0)\times100(\%)$

When the above equation is applied to the example of FIG. 20, it will be $(2884.91/168)\times100$, which shows that the final electron dose ratio of pattern PA is 17.17%.

The final electron dose ratio of other patterns are calculated as described above.

Figure 21:
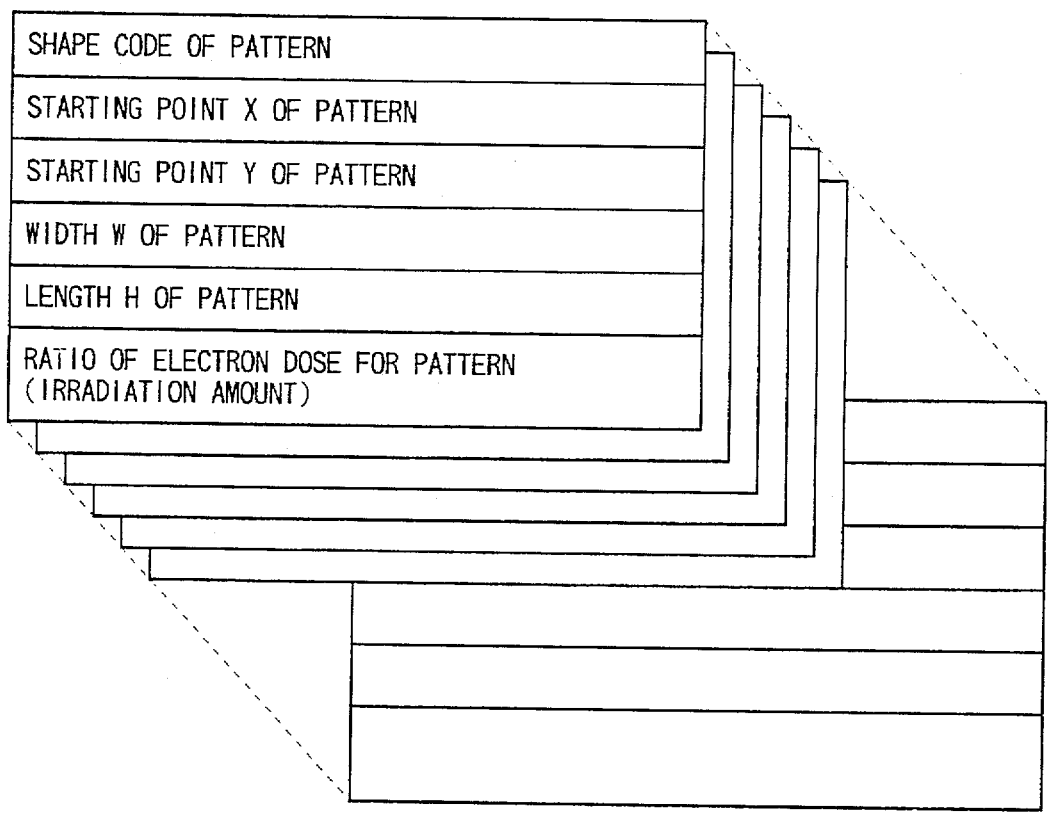
FIG. 21 is a view showing the format to store information relating to the individual pattern.

The final electron dose ratio of the individual pattern present in the independently arranged subfield is stored in a form of pattern information shown in FIG. 21. As shown in FIG. 21, the individual pattern information includes the shape code of the individual pattern to be corrected. The rival relations between the shape of the pattern and the code are preliminarily determined. Furthermore, the pattern information includes X and Y coordinates at the starting point of the pattern to be corrected, pattern width W and pattern length H. Furthermore, the pattern information includes the electron dose ratio (irradiation amount) of the pattern to be corrected which is obtained by the above equation.

Figure 22C:
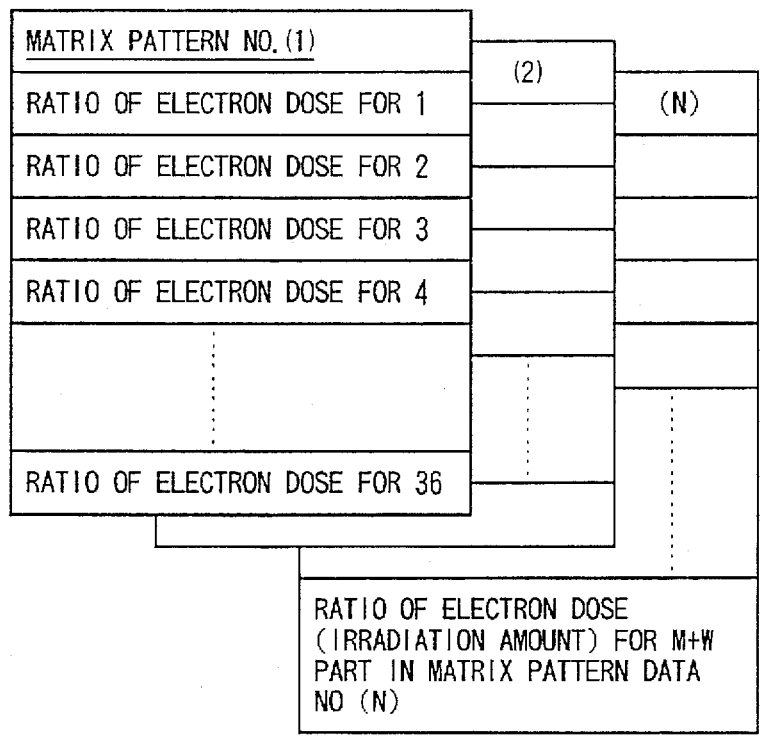

Furthermore, the final electron dose ratio of the matrix pattern is stored as shown in FIGS. 22A, 22B and 22C. FIG. 22A shows the situation that the matrix patterns are arranged six in X direction and six in Y direction. The number in each matrix pattern shows the order of occurrence of the matrix pattern data. The matrix pattern with a letter A which occurs first means the reference pattern. Furthermore, it means the matrix pattern No. of 36 identical matrix patterns of (1). In the case of matrix pattern data, since there is a case that the final electron dose ratio is different as described below, the matrix arrangement information of the matrix actually present shown in FIG. 22B and the information of electron dose ratio of the matrix shown in FIG. 22C are formed.

The matrix arrangement information shown in FIG. 22B includes the shape code of the matrix pattern (the rival relations between the shape of the pattern and the code are preliminarily determined), and X and Y coordinates at the starting point of the pattern to be corrected, pattern width W and pattern length H. Furthermore, the pattern information includes the pitch in X direction, the pitch in Y direction, number of matrix patterns in X direction and number of matrix patterns in Y direction.

The information of the electron dose ratio of the matrix shown in FIG. 22C includes the electron dose ratio (irradiation amount) after the review of each matrix pattern obtained based on the number of matrix patterns. FIG. 22C shows the situation that the electron dose ratio (the value after the review process mentioned above) of each of 36 matrix patterns in the matrix pattern No. 1 is stored.

Step S51 or S54 of FIG. 10 described above is repeated until the process of all subfields and all fields are completed.

Here, the process of step S55 for re-mapping is carried out when the size of the mesh in the map is not proper and plural patterns exist in each map. In this re-mapping process, a map of finer meshes is further formed per each subfield. At this time, in the case where there is no limitation in the capacity of the available memory, the above-mentioned process can be carried out by using a map of further finer meshes.

Figure 23:
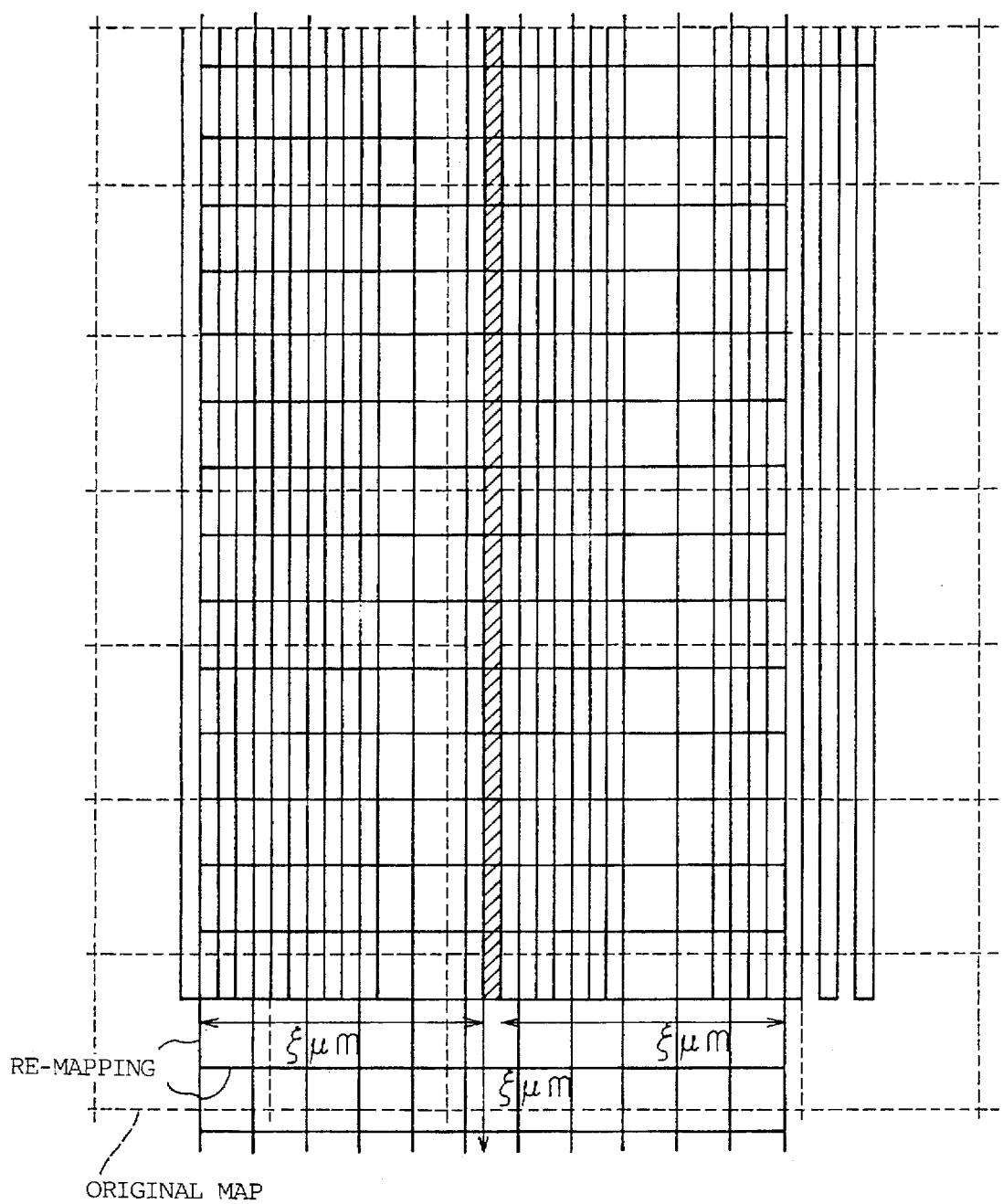
FIG. 23 is a view explaining the re-mapping process.

Furthermore, when the capacity of the memory is not enough, the map is not fined per each subfield, but as shown in FIG. 23, the map is fined in the taking-in area in the periphery of $\xi\mu m$ of one pattern to form the revised map. In FIG. 23, the rectangle of a solid line running in Y direction means the pattern of wiring and the like. The pattern with an oblique line is a pattern to be corrected. A map shown by a dotted line is the original map. When re-mapping is carried out in the range of the periphery of $\xi\mu m$ of the pattern to be corrected, the revised map shown by a solid line can be obtained. By using this revised map, step S51 or S54 described above is carried out.

It can be preliminarily set from outside whether re-mapping is carried out or not, or the re-mapping can be automatically carried out when the number of patterns in one mesh exceeds a certain number. The number of patterns per a mesh unit is obtained by referring to the map information in the subfield of FIG. 13.

Figure 24:
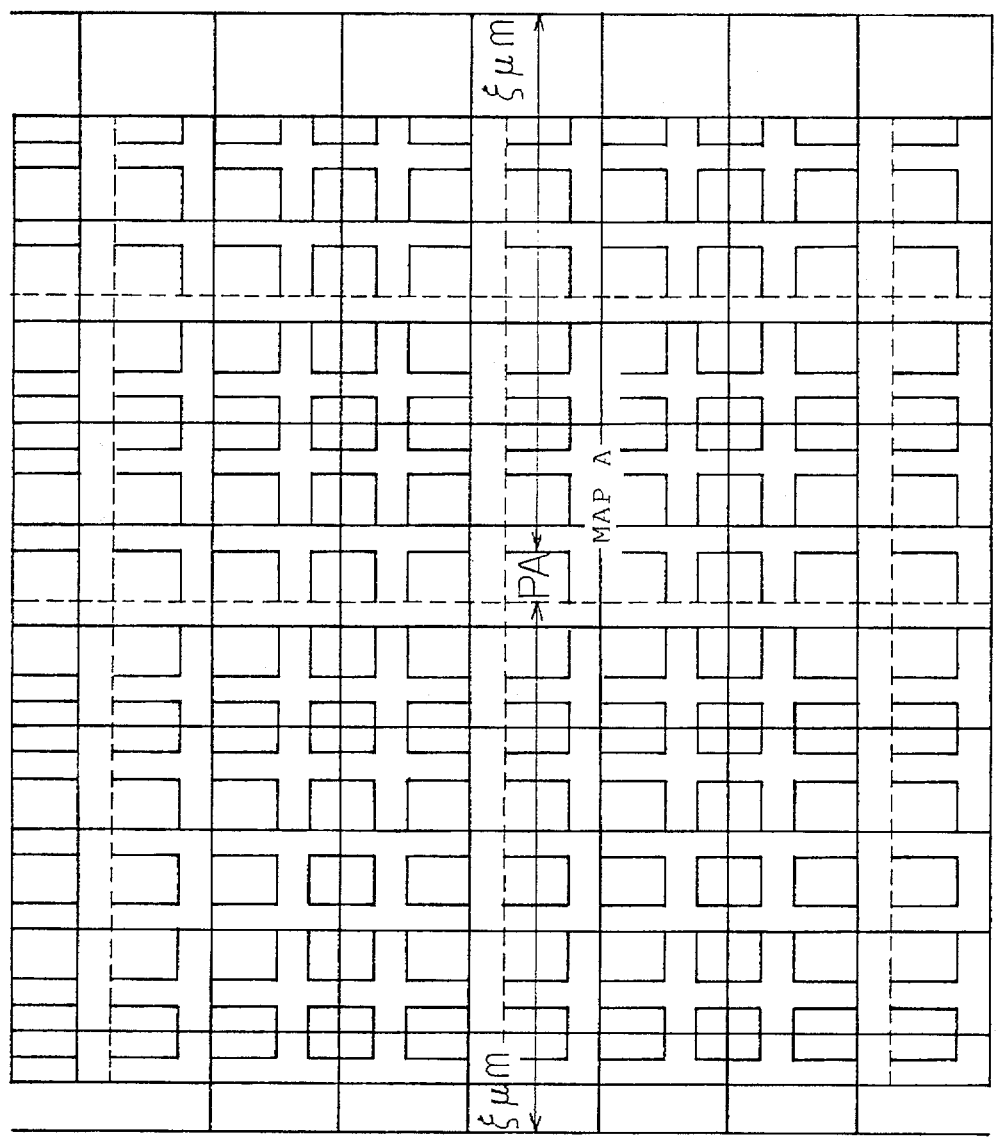
FIG. 24 is an another view explaining the re-mapping process.

FIG. 24 is an another view illustrating the re-mapping process described above. FIG. 24 shows a view of a part of certain subfield pulled out in the range shown by a thick solid line. The dotted line shows the original map. For example, when the number of patterns in the mesh exceeds a certain number, a revised map is generated in the range of the periphery of ξμm of pattern PA to be corrected, as shown in FIG. 24. The process of steps S53 and S54 are carried out for re-mapping.

With regard to the matrix pattern data, the process of developing the matrix pattern data and making revised matrix is carried out at step S56, according to need. The process will be described later.

Next, the calculation of stages of sparse/dense relations (sparse/dense stage) of patterns at process S60 will be described. The sparse/dense stage calculated at process S60 is used to classify stepwisely the sparse/dense relations of patterns according to the final electron dose ratio of each pattern after the review and to prescribe the ratio against the basic irradiation amount per each stage.

First, among the final electron dose ratios of all patterns determined at the step S54 of the process S50, the maximum value and the minimum value are determined. At this process, stored information shown in FIG. 21 and FIG. 22C is referred to. Now, let's assume that the maximum value of the final electron dose ratio in all patterns is 88.56% and the minimum value thereof is 17.17%. By utilizing these maximum value and the minimum value, the stage of sparse/dense relations is decided as shown in FIG. 25. Namely, the difference between the maximum value and the minimum value is divided into 5. The sparse/dense stage 5 of FIG. 25 shows the range from 0% to the value obtained by adding the value divided into 5 to the minimum value of the final electron dose ratio. And the sparse/dense stage 1 shows the range up to the value obtained by subtracting the value divided into 5 from the maximum value of the final electron dose ratio.

The sparse/dense stage 5 has a sparse pattern, and the ratio which is multiplied by the basic irradiation amount is set to be large (1.80 in the example of FIG. 25). Furthermore, the sparse/dense stage 1 has a dense pattern, and the ratio which is multiplied by the basic irradiation amount is set to be small (1.00 in the example of FIG. 25). Incidentally, the sparse/dense stage is not limited to 5 stages, and optional number of stages can be used. Furthermore, it may be decided by utilizing a distribution of logarithm instead of using the above-mentioned equalizing process. In this case, as the sparse/dense stage becomes large, the ratio multiplied by the basic irradiation amount becomes large logarithmically.

After determining the sparse/dense stage of the pattern at process S60, a correction process at process 70, that is, a process for setting the irradiation amount per pattern is carried out. First, at step S71 of process S70, the proportion of the basic irradiation amount corresponding to the sparse/dense stage of patterns determined at process S60 is determined for the patterns to be corrected included in own subfield, which is multiplied by the basic irradiation amount to calculate the irradiation amount of the pattern to be corrected. In the case where the pattern to be corrected is an individual pattern, the determined irradiation amount is set in the pattern data to be corrected shown in FIG. 21. Furthermore, in the case where the pattern to be corrected is a matrix pattern, the determined irradiation amount is set per each matrix pattern in the information of the matrix electron dose ratio of FIG. 22C.

Figure 26:
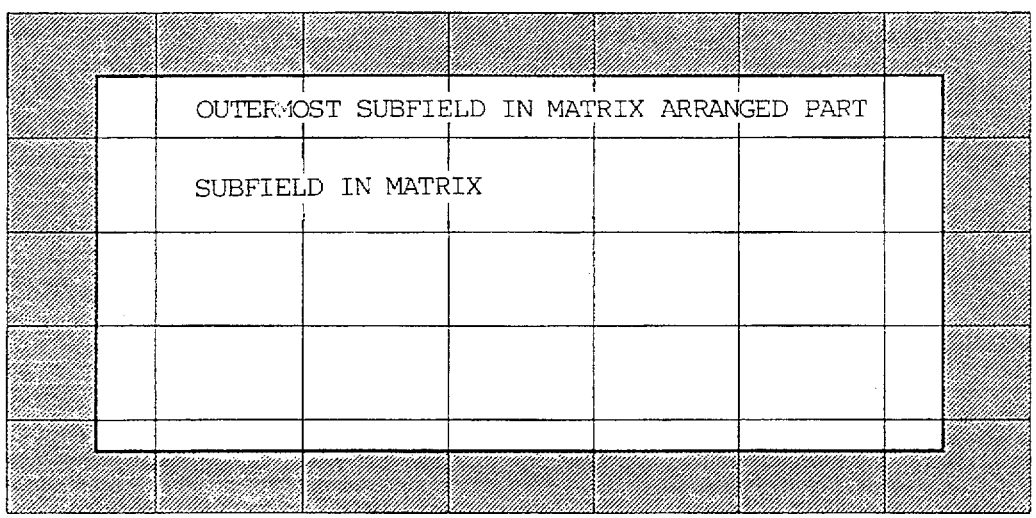
FIG. 26 is a view explaining the mapping process of the matrix arranged portion.

Here, the calculation of the irradiation amount of the matrix pattern of the matrix arranged portion is carried out as follows. FIG. 26 is a view showing one matrix arranged portion. As described above, the matrix arranged portion has matrix outermost subfields and matrix inner subfields. The electron dose ratio of the matrix outermost subfields may differ from the electron dose ratio of the matrix inner subfields. The same thing may be said with regard to the sparse/dense stages of the pattern. Considering these points, the following process is carried out.

Figure 7:
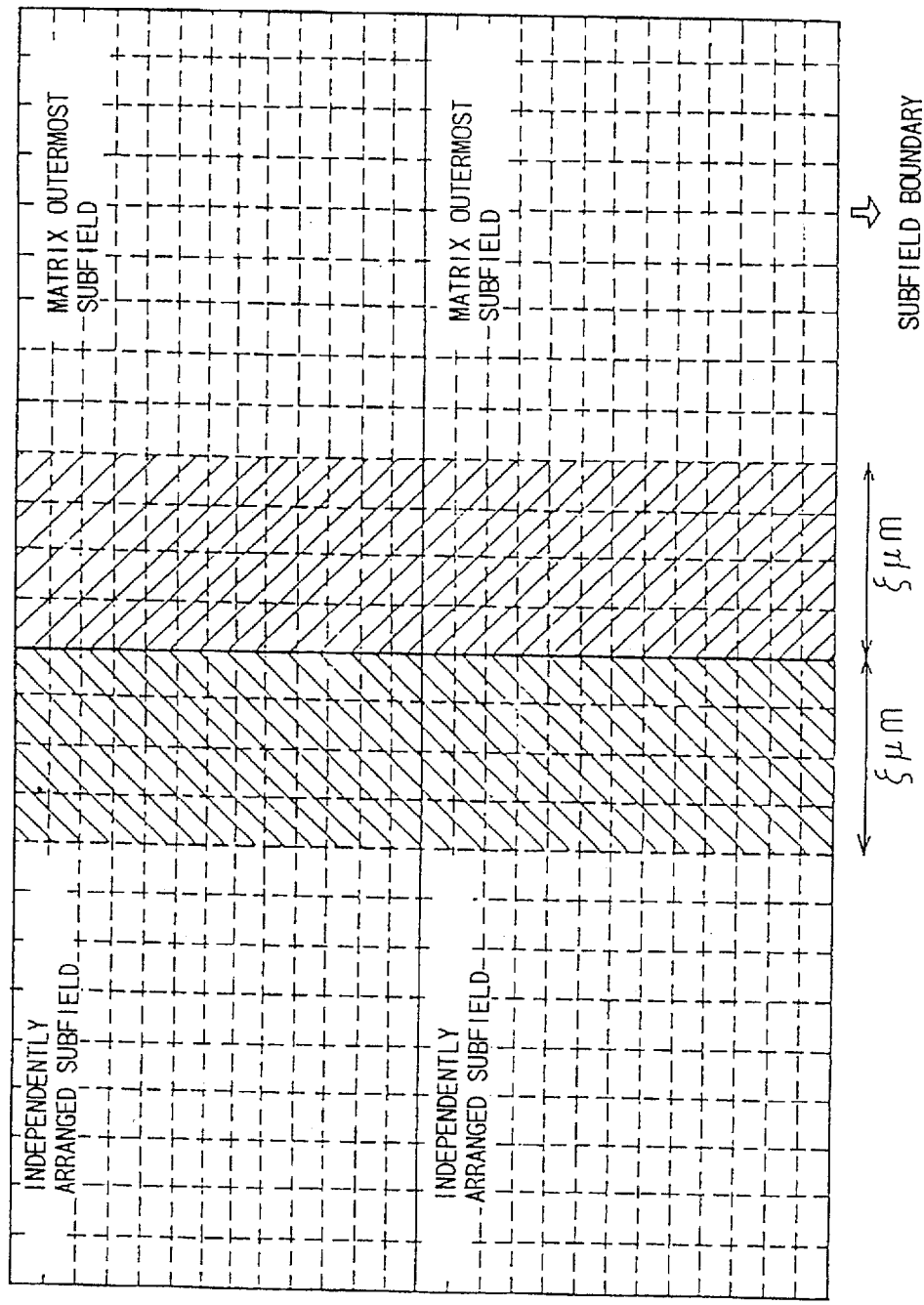
FIG. 7 is a view showing the boundary portion of the independently arranged subfield and the matrix outermost subfield.
Figure 8:
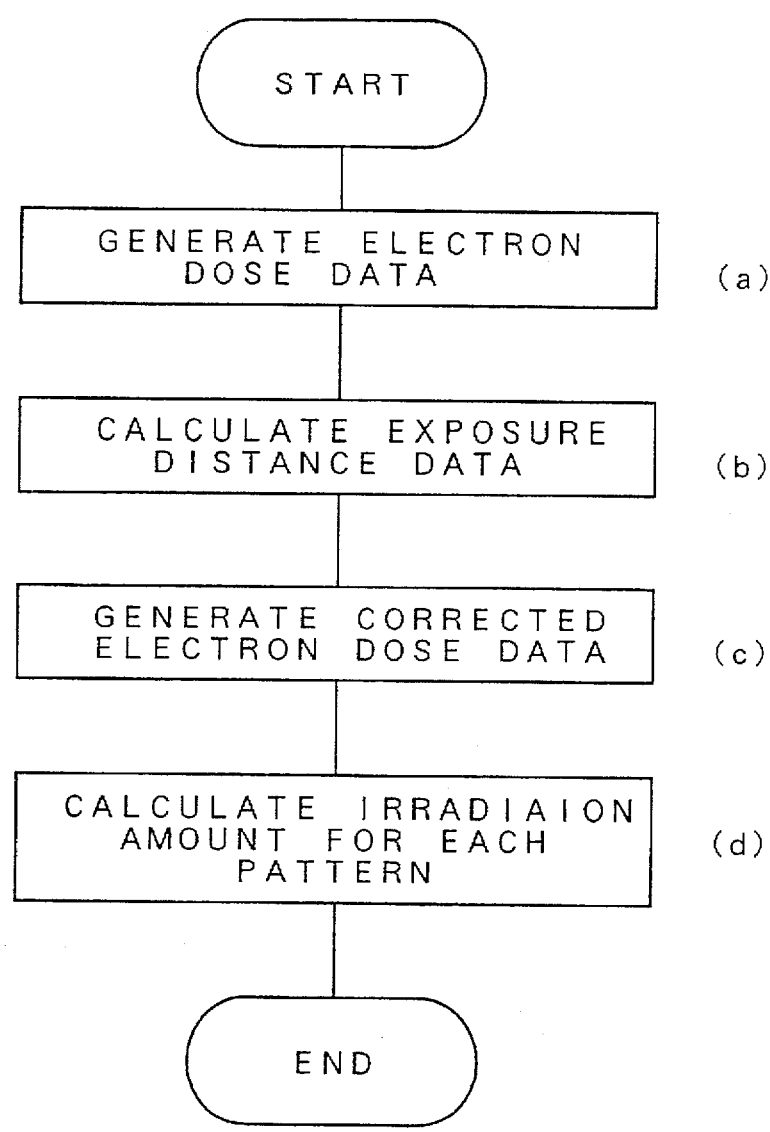
FIG. 8 is a flow chart showing the structure of the method for processing the electron dose data of the present invention.

The maximum electron dose ratio is set for each matrix inner subfields without carrying out the mapping process, and the ratio of the basic irradiation amount corresponding thereto is determined from the sparse/dense stages, which is multiplied by the basic irradiation amount to decide the irradiation amount. Furthermore, the irradiation amount of the area shown by an oblique line in the matrix outermost subfield (the range which is affected by the peripheral patterns and corresponds to the area of ξμm of FIG. 7) is calculated by determining the proportion of the ratio of the basic irradiation amount from the sparse/dense stages of the pattern corresponding to the electron dose ratio stored in FIG. 22C and multiplying it by the basic irradiation amount. Incidentally, with regard to the area outside the part defined by the oblique line in the matrix outermost subfield, mapping process is not carried out, but the irradiation amount is determined by the same manner as in the matrix inner subfield. That is, in the area outside the part defined by the oblique line, the electron dose ratio is not substantially varied.

After the process of step S71 is completed, the heat correction process is carried out as has been carried out conventionally at step S72, according to need. Step S72 is, for example, for the case where the extension of the pattern or an additional process is required.

Figure 27A:
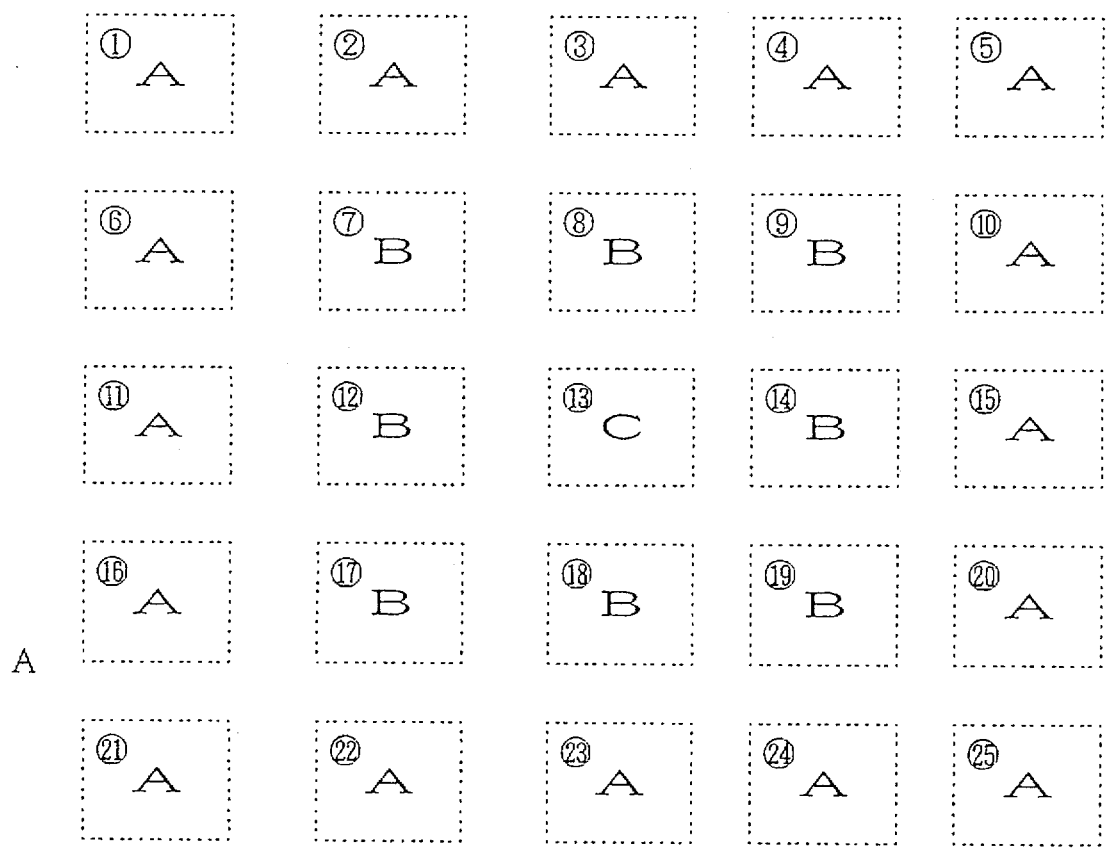

After the processes of step S71 and S72 are completed, when the irradiation amount of the matrix pattern is different, the matrix recognition process shown in FIGS. 27A and 27B is carried out (step S73). FIG. 27A shows the case where identical patterns are arranged, 5 in X direction, 5 in Y direction, in total 25. The numbers from 1 to 25 (encircled) in the drawing, show the pattern number which identifies each matrix pattern. Pattern No. 21 (encircled) is set as the matrix reference pattern. Furthermore, the letters A, B and C shown on each matrix pattern means the irradiation amount.

When the irradiation amount determined from the final electron dose ratio at step S71, by referring to the stages of sparse/dense relations differs as shown in FIG. 27A, or when any of the starting point (X,Y) of each pattern, pattern width W or pattern length H is different at the heat correction process of step S72, it does not form a matrix pattern having 5 in the original X direction and 5 in the original Y direction. Since all data of matrix patterns should coincide, when a data of one matrix pattern is different from a data of other matrix patterns, 25 patterns cannot be treated as a matrix pattern any more.

In such cases, the matrix recognition process (step S73) is carried out to develop the matrix pattern in two dimensions on the memory (step S74), and to sort out the arrangement of originally matrix pattern into the individual pattern and the matrix pattern. FIG. 20(A) shows the case where the irradiation amount differs in A, B and C at the process of step S71. When there is no change in the starting point coordinates of the matrix pattern, and pattern width W and pattern length H do not vary, the matrix recognition process is carried out by referring to only the value of the irradiation amount. The result of applying the above-mentioned matrix recognition process to the matrix pattern of FIG. 27A is shown in FIG. 27B.

After the process of step S74 is completed, it is converted so that it will fit the data format suitable for the charged particle beam exposure device using the data of FIGS. 21 and 22 (step S75).

The above-mentioned process S70 is carried out for all subfields and fields. Furthermore, if there is the next layer (for example, another type of chip), return to process S30 and similar processes are carried out.

Processes S30 to S70 shown in FIG. 9 and FIG. 10 may be carried out in series, or some processes may be carried out in parallel. For example, the set up of the electron dose ratio per each mesh at step S50 and the set up of the irradiation amount per each pattern at step S70 may be carried out in parallel.

Figure 28:
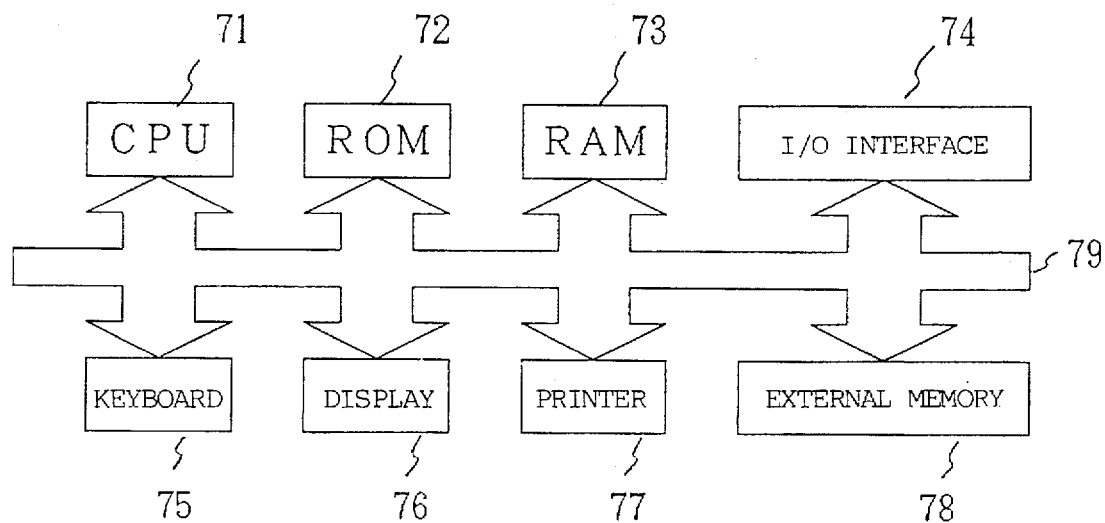
FIG. 28 is a block diagram showing the structure of the apparatus for processing the electron dose data of the present invention.

FIG. 28 is a block diagram of a computer system which performs the above-mentioned method for processing the electron dose data. The computer system shown in FIG. 28 comprises CPU71, ROM72, RAM73, I/O interface unit 74, keyboard 75, display unit 76, printer 77 and external memory 78. These components are connected mutually via a bus 79.

ROM72 stores the programs of the flow chart shown in FIG. 9 and FIG. 10, and CPU executes. From the standpoint of functions, CPU71 has, for example, the first or the fourth functional blocks (means) corresponding respectively to each step (a) or (d) shown in FIG. 9. Furthermore, CPU71 may be said to have a functional block which carries out each process of FIG. 9 and FIG. 10. The data shown in FIG. 21 and FIGS. 22A, 22B and 22C are stored in RAM73 which functions as a working area of external memory 78 and CPU71. Data and commands which are input to the computer system are given via a keyboard 75. The keyboard 75 comprises various data input means, such as a mouse. The computer system is connected to external devices, such as a data processing system of the charged particle beam exposure device, via I/O interface unit 74.

Figure 29:
FIG. 29 is a block diagram showing the computer system for carrying out the parallel process.

FIG. 29 shows a computer system for carrying out the above-mentioned parallel process. As illustrated, for example, 2 computers are mutually connected, and one of them may carry out the process S50 shown in FIG. 10, and the other may carry out the process S70 shown in FIG. 10.

One preferred embodiment of the present invention has been described in detail. The present invention, however, is not limited to the above embodiment and includes various varieties.

As described above, according to the present invention, the electron dose data relating to the exposure per each pattern in the area to be exposed is formed, and based on this electron dose data, calculating the exposure distance data which shows the degree of correction of the electron dose data based on the positional relation of each pattern as a pattern to be corrected in sequence with patterns in a predetermined range in the periphery thereof, and correcting the electron dose data with the exposure distance data to form a corrected electron dose data of each pattern, and based on this corrected electron dose data, the irradiation amount of each pattern is calculated, whereby the relations between patterns can be reflected on the exposure, and the method and the device for forming the electron dose data which can form a highly accurate electron dose data can be provided.

The present invention is not limited to the specifically disclosed embodiment, and variations and modifications may be made without departing from the scope of the present invention.

What is claimed is:

1. A method, performed by a computer, for processing exposure data corresponding to a pattern to be formed on a wafer by exposure with a charged particle beam, said method comprising:

(a) generating electron dose data relating to exposure per each pattern in an exposure area on the wafer;

(b) generating meshes on the exposure area, each of the meshes being smaller than a main field and a subfield;

(c) generating electron dose data for a pattern of interest for each of the meshes in which the pattern of interest is located, each pattern of interest having a periphery;

(d) calculating exposure distance data indicating a degree to correct the electron dose data of the pattern of interest for each of the meshes based on positional relations between the meshes in which the pattern of interest is located and peripheral meshes located within a predetermined range of the periphery of the pattern of interest; and (e) correcting the electron dose data of the pattern of interest for each mesh in accordance with the exposure distance data.

2. The method as claimed in claim 1, wherein:

said step (d) further comprises generating an exposure distance data which shows a degree by which to reduce the exposure shown by exposure dose data determined in said step (a), as the distance from the pattern to be corrected in said predetermined range becomes large; and multiplying said electron dose data by the exposure distance data.

3. The method as claimed in claim 1, further comprising the steps of:

(f) detecting a maximum value and a minimum value of the electron dose data; and (g) generating stage information of sparse/dense relations so as to divide a distribution range of values shown by the electron dose data based on said maximum value and said minimum value, into plural stages based on sparse/dense relations of the pattern; and (h) calculating an irradiation amount of each pattern by using said stage information of sparse/dense relations and a predetermined basic irradiation amount.

4. The method as claimed in claim 1, wherein:

said step (a) further comprises dividing said area to be exposed into plural field areas, each comprising plural subfields; and dividing subfields having an individual pattern differing from other patterns into plural meshes in the form of matrix, including a predetermined range in the periphery thereof to generate the electron dose data per said mesh.

5. The method as claimed in claim 1, wherein:

said step (a) further comprises step (a-2) for dividing said area to be exposed into plural field areas, each comprising plural subfields; and said step (a-1) comprises step (a-1-1) for dividing an outermost field adjacent to the subfield having an individual pattern which differs from other patterns, among plural subfields having identical plural matrix patterns arranged continuously, into plural meshes in the form of matrix, including a predetermined rage in the periphery thereof, to generate the electron dose data per said mesh.

6. A method performed by a computer for processing exposure data corresponding to a pattern formed on a wafer by exposure with a charred particle beam, said method comprising the steps of:

(a) generating electron dose data relating to exposure of a first pattern to be exposed on the wafer;

(b) calculating exposure distance data indicative of positional relations on the wafer of meshes obtained by dividing an exposed surface of the wafer; and (c) correcting the electron dose data related to said first pattern on the basis of the positional relations between meshes in which said first pattern to be exposed is present and other meshes in which a second pattern, which may affect exposure of said first pattern, is present.

7. A device for processing exposure data corresponding to a pattern formed on a wafer by exposure with a charged particle beam, said device comprising:

first means for generating electron dose data relating to exposure of a first pattern to be exposed;

second means for calculating exposure distance data indicative of positional relations of meshes obtained by dividing an exposed surface on the wafer; and third means for correcting the electron dose data related to said first pattern on the basis of the positional relations between first meshes, in which said first pattern to be exposed is present, and other meshes, in which a second pattern which may affect exposure of said first pattern is present.

8. A device for processing exposure data corresponding to a pattern formed on a wafer by exposure with a charged particle beam, said device comprising:

a first unit generating electron dose data relating to exposure per each pattern in an area to be exposed on the wafer, the area to be exposed being divided into meshes, each of the meshes being smaller than a main field and a subfield;

a second unit calculating exposure distance data indicating a degree of correction of the electron dose data based on positional relations on the wafer of each pattern as a pattern to be corrected in sequence with patterns in a predetermined range in a periphery thereof, based on the electron dose data determined by said first unit;

a third unit correcting the electron dose data determined by said first unit with the exposure distance data determined by said second unit to generate corrected electron dose data of each mesh in each pattern; and a fourth unit calculating an irradiation amount of each pattern based on the corrected electron dose data.

* * * * *

UNITED STATES PATENT AND TRADEMARK OFFICE
CERTIFICATE OF CORRECTION

PATENT NO. : 5,754,443
DATED : May 19, 1998
INVENTOR(S) : Yasuo MANABE

It is certified that error appears in the above-identified patent and that said Letters Patent is hereby corrected as shown below:

Title Page, Assignee, change "KANAGAWA" to --KAWASAKI--.

Col. 6, line 44, change "purport" to --purpose--;
       line 53, after "directions" insert --,--;
       line 54, after "in the" insert --map--.

Col. 7, line 14, after "patterned" insert --date--;
       line 23, after "H" insert --;--.

Col. 13, line 34, after "CPU" insert --71-- and after "executes" insert --same--.

Signed and Sealed this

Eleventh Day of May, 1999

Attest:

Q. TODD DICKINSON

*Attesting Officer*    *Acting Commissioner of Patents and Trademarks*